US012646567B2

(12) United States Patent　　　　(10) Patent No.:　US 12,646,567 B2

Khanna　　　　　　　　　　　　　(45) Date of Patent:　　　Jun. 2, 2026

(54) TECHNIQUES FOR FASTER RAMP-UP TIMES FOR UNSELECTED WORD LINES IN NON-VOLATILE MEMORY

(71) Applicant: Sandisk Technologies, Inc., Milpitas, CA (US)

(72) Inventor: Sajal Khanna, Bangalore (IN)

(73) Assignee: Sandisk Technologies, Inc., Milpitas, CA (US)

( * ) Notice: Subject to any disclaimer, the term of this patent is extended or adjusted under 35 U.S.C. 154(b) by 119 days.

(21) Appl. No.: 18/617,898

(22) Filed: Mar. 27, 2024

(65)　　　　　　Prior Publication Data

US 2025/0308596 A1　　　Oct. 2, 2025

(51) Int. Cl.
| | |
|---|---|
| *G11C 16/10* | (2006.01) |
| *G11C 5/14* | (2006.01) |
| *G11C 7/10* | (2006.01) |
| *G11C 8/08* | (2006.01) |
| *G11C 11/408* | (2006.01) |
| *G11C 11/4096* | (2006.01) |
| *G11C 16/08* | (2006.01) |
| *G11C 16/26* | (2006.01) |

(52) U.S. Cl.
CPC ............ *G11C 16/102* (2013.01); *G11C 5/145* (2013.01); *G11C 7/1048* (2013.01); *G11C 7/1096* (2013.01); *G11C 8/08* (2013.01); *G11C 11/4085* (2013.01); *G11C 11/4096* (2013.01); *G11C 16/08* (2013.01); *G11C 16/26* (2013.01)

(58) Field of Classification Search
CPC ..... G11C 16/102; G11C 5/145; G11C 7/1048; G11C 7/1096; G11C 8/08; G11C 11/4085; G11C 11/4096; G11C 16/08; G11C 16/26
See application file for complete search history.

(56)　　　　　　References Cited

U.S. PATENT DOCUMENTS

| | | | |
|---|---|---|---|
| 7,463,531 | B2 | 12/2008 | Hemink et al. |
| 8,106,701 | B1 | 1/2012 | Huynh et al. |
| 8,385,115 | B2 | 2/2013 | Lee et al. |
| 8,395,434 | B1 | 3/2013 | Nguyen et al. |
| 8,644,075 | B2 | 2/2014 | Hemink et al. |
| 10,726,922 | B2 | 7/2020 | Yang et al. |
| 10,861,571 | B1 | 12/2020 | Yang et al. |
| 11,056,155 | B1 * | 7/2021 | Trinh ...................... G11C 16/10 |
| 2005/0237824 | A1 * | 10/2005 | Umezawa .............. G11C 16/12 365/189.11 |
| 2023/0062829 | A1 * | 3/2023 | Suzuki ................... G11C 5/145 |
| 2024/0105262 | A1 * | 3/2024 | Said ...................... G06F 3/0659 |
| 2025/0226034 | A1 * | 7/2025 | Raghunathan ......... G11C 16/24 |

* cited by examiner

*Primary Examiner* — Donald HB Braswell
(74) *Attorney, Agent, or Firm* — Pearl Cohen Zedek Latzer Baratz LLP

(57)　　　　　　ABSTRACT

In a non-volatile memory array such as a NAND memory, when a word line of a block is selected for a read or write, the selected word line is biased at one level through one decoding path, while the unselected word lines of a block are biased at a different level though another decoding path. For memory operations, such as leakage detection, in which all of the word lines are biased with the same level, such as an unselected voltage level, the selected word line decoding path is otherwise unused. To increase the speed with which word lines can be ramped-up, for operation that bias all of the word lines of a block at the unselected level, both of the decoding paths can be used concurrently to reduce ramp-up times.

20 Claims, 25 Drawing Sheets

403
405
Block M-1
Block M-1
407
Block 2
Block 1
Block 0
Block 2
Block 1
Block 0

Bit Line — 414

417 — 422/482 — 434

402

Upper Tier, 421

495 —

497

499 — 445 —

493

SGD0
SGD1
SGD2
DD0
DD1
WL161
WL160
WL159
WL158
WL157
WL156

402

WL81
WLIFDU
IF
WLIFDL
WL80
WL79

499 — 497

Lower Tier, 423

402

WL3
WL2
WL1
WL0
DDS
SGS2
SGS1
SGS0
SL

457 — 454

700

| Apply a high voltage (e.g., Vpgmu) to all word lines in block | ~ 702 |

| Apply a low voltage (e.g., Vss) to a region of the memory structure | ~ 704 |

| Determine whether leakage current is detected | ~ 706 |

| BL | VSS (0V) |
|---|---|
| SGD | Vsgd |
| DD | Vpass |
| WL81 to WL161 | Vpgmu |
| WLIFDU | Vpass |
| WLIFDL | Vpass |
| WL0 to WL80 | Vpgmu |
| DS | Vpass |
| SGS | Vsgs |
| SL | VSS (0V) |

800

Identify available free block to transfer valid data —802

Copy valid data from selected block into free block —804

Erase the selected block —806

808
Perform stress test?     No

Yes

810
Perform stress test on block

814
No     Block pass stress test?     Yes

Retire the block —816

Allocate the selected block to free block pool —812

TECHNIQUES FOR FASTER RAMP-UP TIMES FOR UNSELECTED WORD LINES IN NON-VOLATILE MEMORY

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An example of non-volatile memory is flash memory (e.g., NAND-type and NOR-type flash memory). Users of non-volatile memory typically want the memory to operate at high speeds so that they do not need to wait for memory operations to be completed.

BRIEF DESCRIPTION OF THE DRAWINGS

Like-numbered elements refer to common components in the different figures.

FIG. 4A is a block diagram of one embodiment of a memory structure having two planes.

FIG. 17 is a set of waveforms for an embodiment of operating the level shifter of FIG. 16 with an initial pulse to facilitate turn on.

DETAILED DESCRIPTION

An important consideration in the performance of non-volatile memory devices is the speed with which they can perform memory operations, including operations such the reading and writing of user data, but also non-user operations such as leakage detection. To perform any of these memory operations, the memory cells of an array need to be biased. The more quickly that the biased levels can be established, the more quickly that an operation can be performed. The bias levels are provided from voltage supplies, such as generated through charge pumps, and applied to the memory array through drivers and other decoding circuitry. In a memory array such as a NAND memory, when a word line of a block is selected for a read or write, it is biased at one level through one decoding path, while the unselected word lines are biased at a different level though another decoding path. For memory operations, like leakage detection, in which all of the word lines are biased with the same level, such as an unselected voltage level, the selected word line decoding path is otherwise unused. To increase the speed with which word lines can be ramped-up for operation that bias all of the word lines of a block at the unselected level, both of the decoding paths can be used concurrently.

Figure 1:
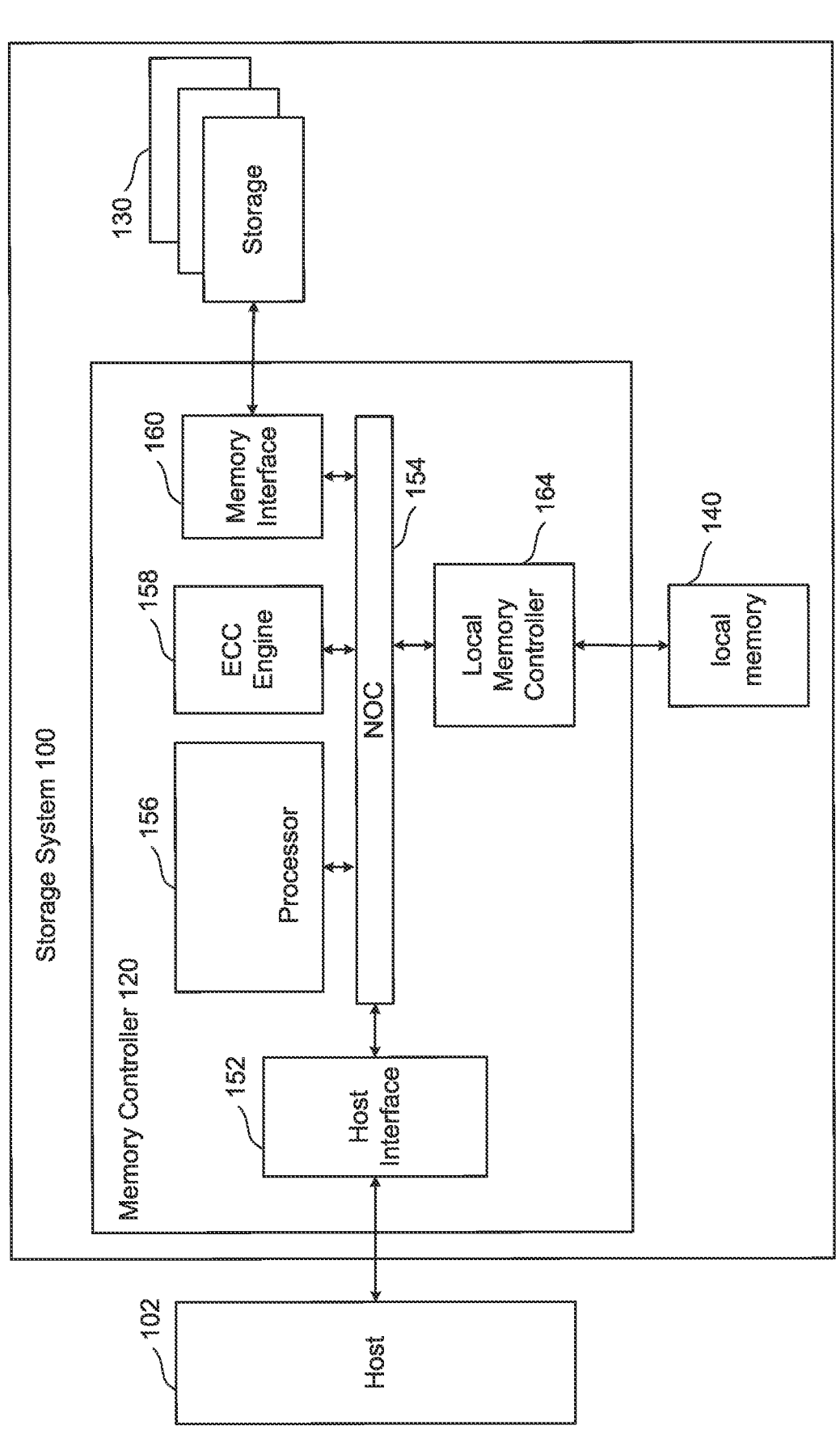
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
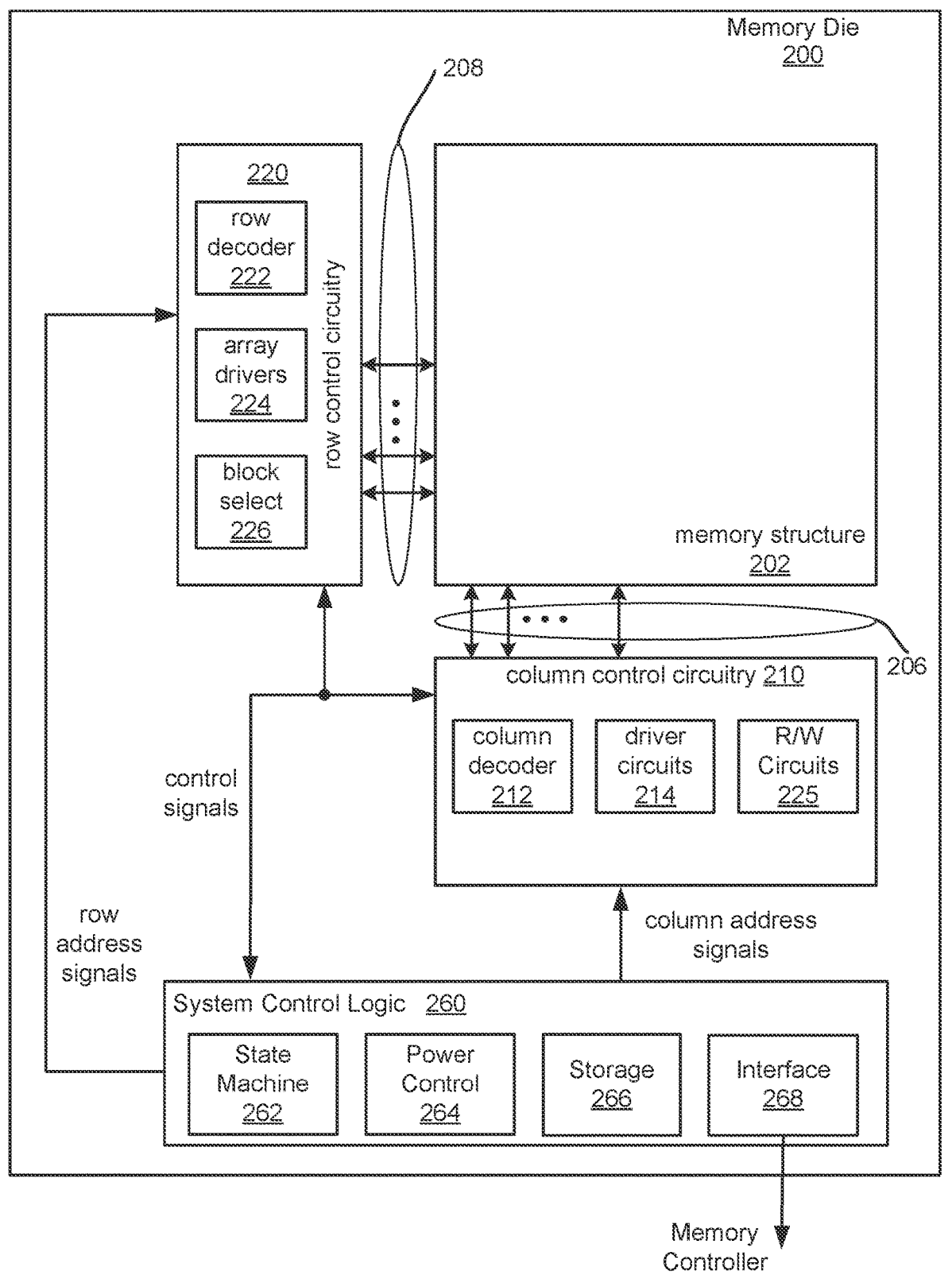
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only a single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of current, voltage, light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
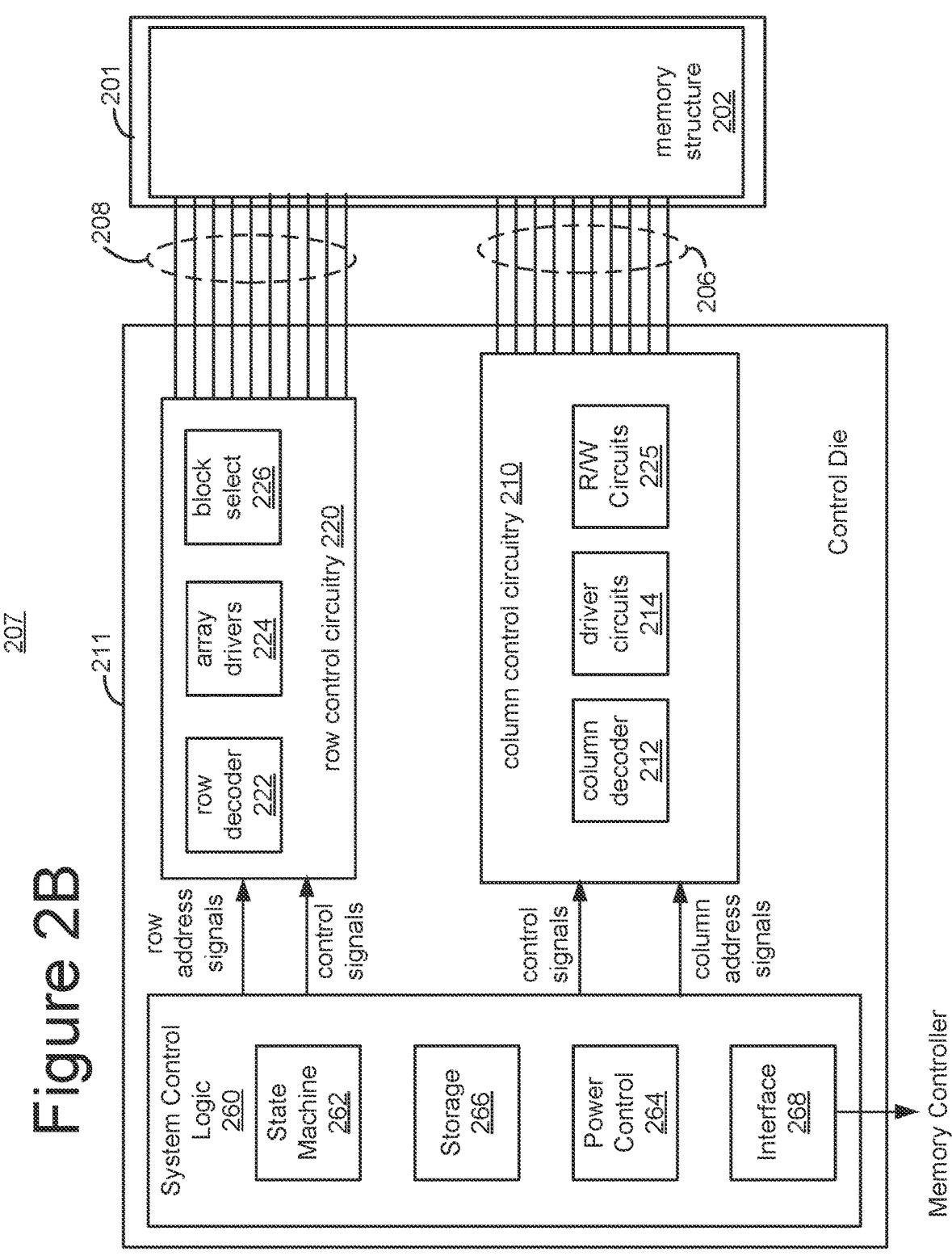
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figures 3A, 3B:
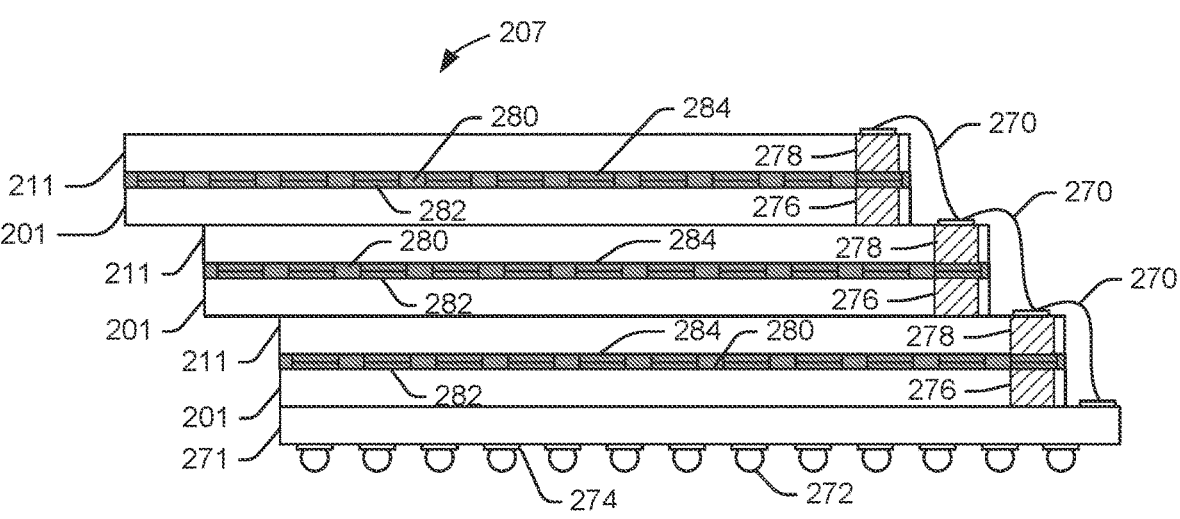
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together.

Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 4:
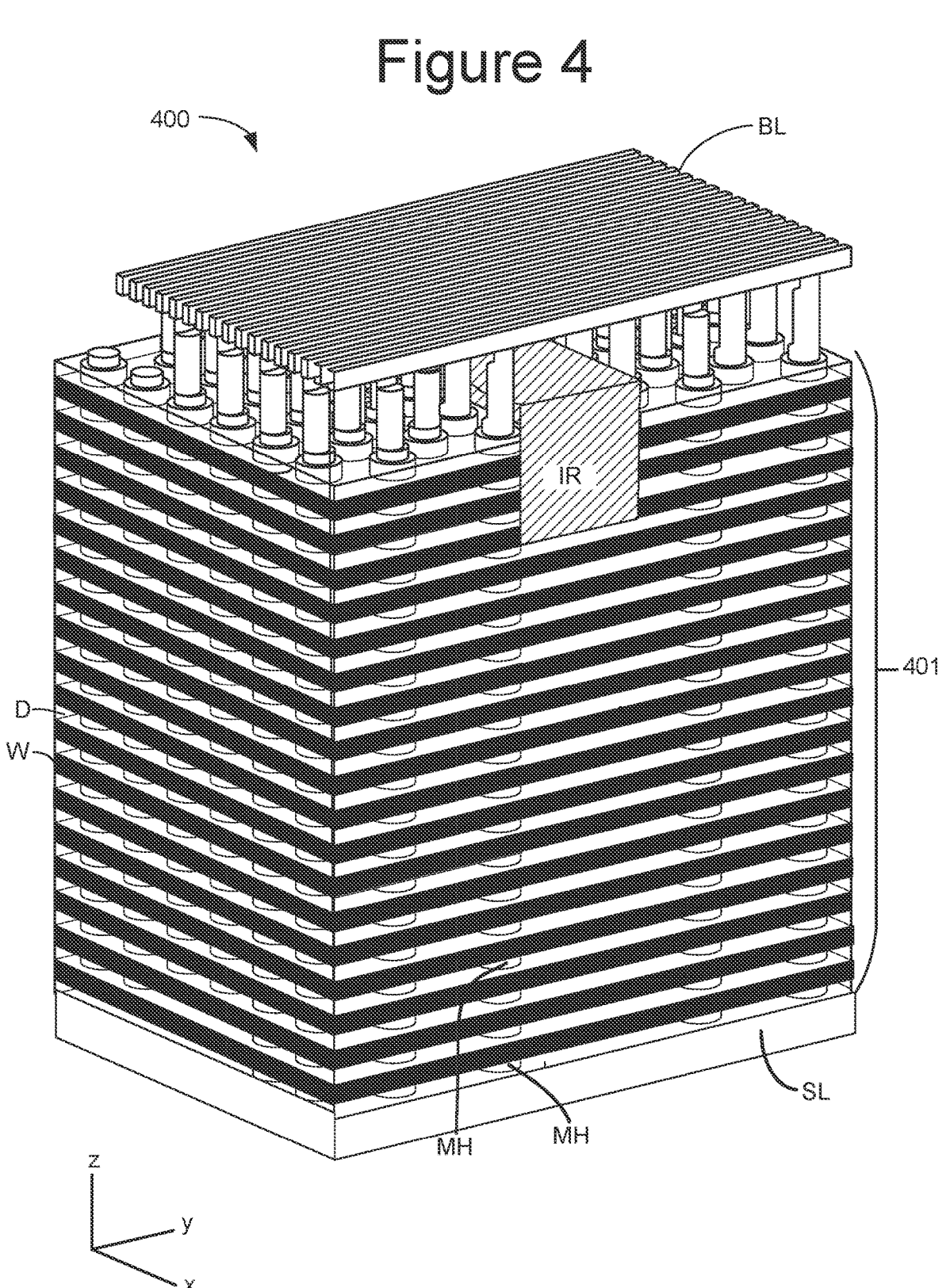
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

FIG. 4A is a block diagram explaining one example organization of memory structure 202, which is divided into two planes 403 and 405. Each plane is then divided into M blocks. In one example, each plane has about 2000 blocks. However, different numbers of blocks and planes can also be used. In one embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
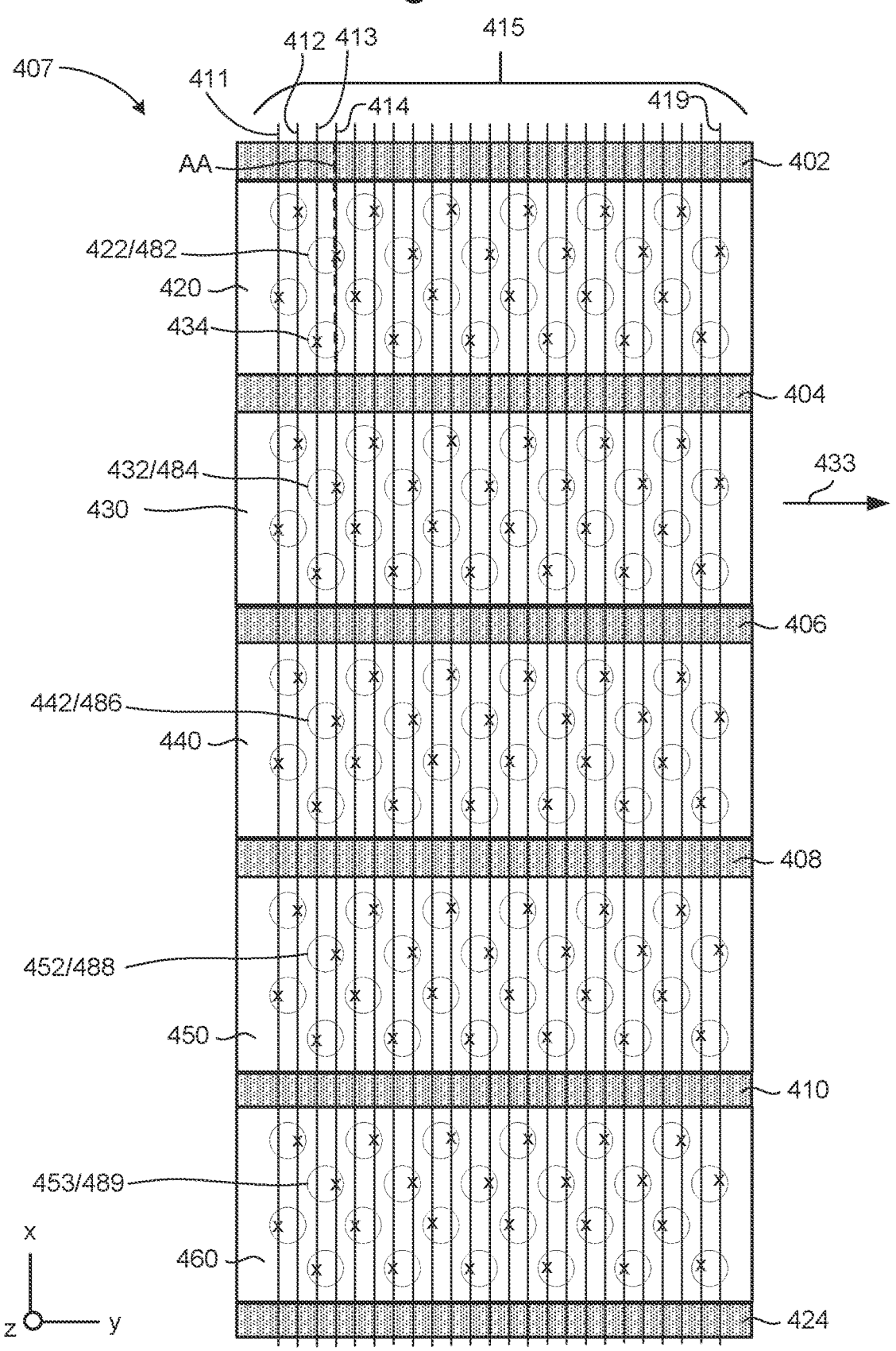
FIG. 4B is a block diagram depicting a top view of a portion of block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a block diagram depicting a top view of a portion 407 of Block 2. As can be seen from FIG. 4B, the block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452, and 453. Vertical column 422 implements NAND string 482. Vertical column 432 implements NAND string 484. Vertical column 442 implements NAND string 486. Vertical column 452 implements NAND string 488. Vertical column 453 implements NAND string 489. More details of the vertical columns are provided below. Since the block depicted in FIG. 4B extends in the direction of arrow 433, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442, 452, and 453.

The block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the block into five regions; for example, the top layer depicted in FIG. 4B is divided into regions 420, 430, 440, 450, and 460 of which are referred to as sub-blocks. In one embodiment, isolation regions 402 and 424 separate the block from adjacent blocks. Thus, isolation regions 402 and 424 may extend down to the substrate. In one embodiment, the isolation regions 404, 406, 408, and 410 only divide the layers used to implement select gates so that NAND strings in different sub-blocks can be independently selected. Referring back to FIG. 4, the IR region may correspond to any of isolation regions 404, 406, 408 or 410. In one example implementation, a bit line only connects to one vertical column/NAND string in each of regions (sub-blocks) 420, 430, 440, 450 and 460. In that implementation, each block has twenty rows of active columns and each bit line connects to five vertical columns/NAND strings in each block. In one embodiment, all of the five vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region having four rows of vertical columns, five regions and twenty rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
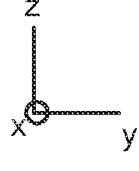
FIG. 4C depicts an embodiment of a stack showing a cross-sectional view along line AA of FIG. 4B.

FIG. 4C depicts a portion of one embodiment of a three dimensional memory structure 202 showing a cross-sectional view along line AA of FIG. 4B. This cross sectional view cuts through vertical columns (NAND strings) 422 and 434 of region 420 (see FIG. 4B). The structure of FIG. 4C includes three drain side select gate layers (SGD0, SGD1 and SGD2). The structure of FIG. 4C also includes three source side select gate layers (SGS0, SGS1 and SGS2). The structure of FIG. 4C also includes five dummy word line layers DD0, DD1, WLIFDU, WLIFDL, DDS; one hundred sixty two word line layers WL0-WL161 for connecting to data memory cells. Dielectric layers are depicted between the conductive layers just described. Other embodiments can be implemented more or fewer than the numbers described above for FIG. 4C. In one embodiment, SGD0, SGD1 and SGD2 are electrically connected together; and SGS0, SGS1 and SGS2 are electrically connected together.

FIG. 4C depicts an embodiment of a stack having two tiers. The two-tier stack comprises an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased.

Vertical columns 422 and 434 are depicted protruding through the drain side select layers, source side select layers, IF layer, dummy word line layers and word line layers. In one embodiment, each vertical column comprises a vertical NAND string. Below the vertical columns and the layers listed below is substrate 457, an insulating film 454 on the substrate, and source line SL. The NAND string of vertical column 422 has a source end at the bottom of the stack and a drain end at the top of the stack. As in agreement with FIG. 4B, FIG. 4C show vertical column 422 connected to bit line 414 via connector 417.

One of the isolation regions 402 is depicted adjacent to the stack, in agreement with FIG. 4B. The isolation region 402 has a conductive region 499 surrounded by an insulating material 497. The conductive region 499 extends down to the source line (SL) and provides operating voltages to the SL. The conductive region 499 may be formed from, for example, tungsten. The insulating material 497 may be formed from, for example, silicon oxide. It is possible for a short circuit to occur between a word line and the conductive region 499. An example defect 495 that results in a short circuit between WL159 and the conductive region 499 is depicted. The conductive region 499 may be referred to herein as a local interconnect (LI). In one embodiment, such word line to LI short circuits are detected. Defects such as defect 495 may be present when the memory structure is manufactured or may develop as a result of normal memory operations.

Another type of short circuit that may be detected is a word line to memory hole short circuit. Defect 493 may result in a short circuit between WL158 and the memory hole 422. In one embodiment, such word line to memory hole short circuits are detected. Defects such as defect 493 may be present when the memory structure is manufactured or may develop as a result of normal memory operations.

For ease of reference, drain side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DDS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
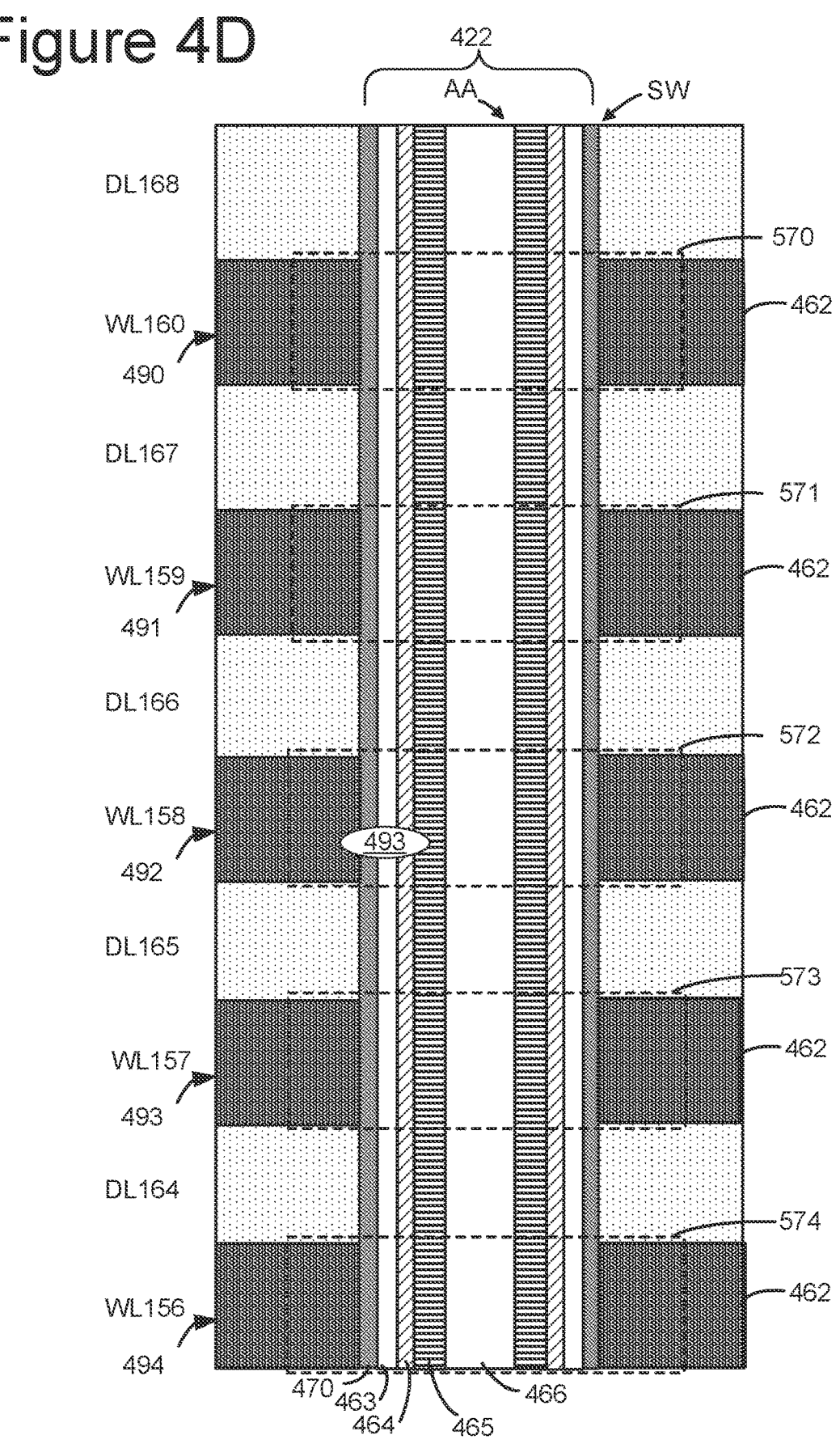
FIG. 4D depicts a view of the region 445 of FIG. 4C.

FIG. 4D depicts a view of the region 445 of FIG. 4C. Included are WL156-160 and dielectric layers DL164-DL168. Data memory cell transistors 570, 571, 572, 573, and 574 are indicated by the dashed lines. A number of layers can be deposited along the sidewall (SW) of the memory hole 422 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

As mentioned above, one type of short circuit that may be detected is a word line to memory hole short circuit. Defect 493 may result in a short circuit between WL158 and one or more of the layers in the memory hole 422 such as, for example, charge-trapping layer 463 and/or polysilicon body 465. In one embodiment, such word line to memory hole short circuits are detected.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
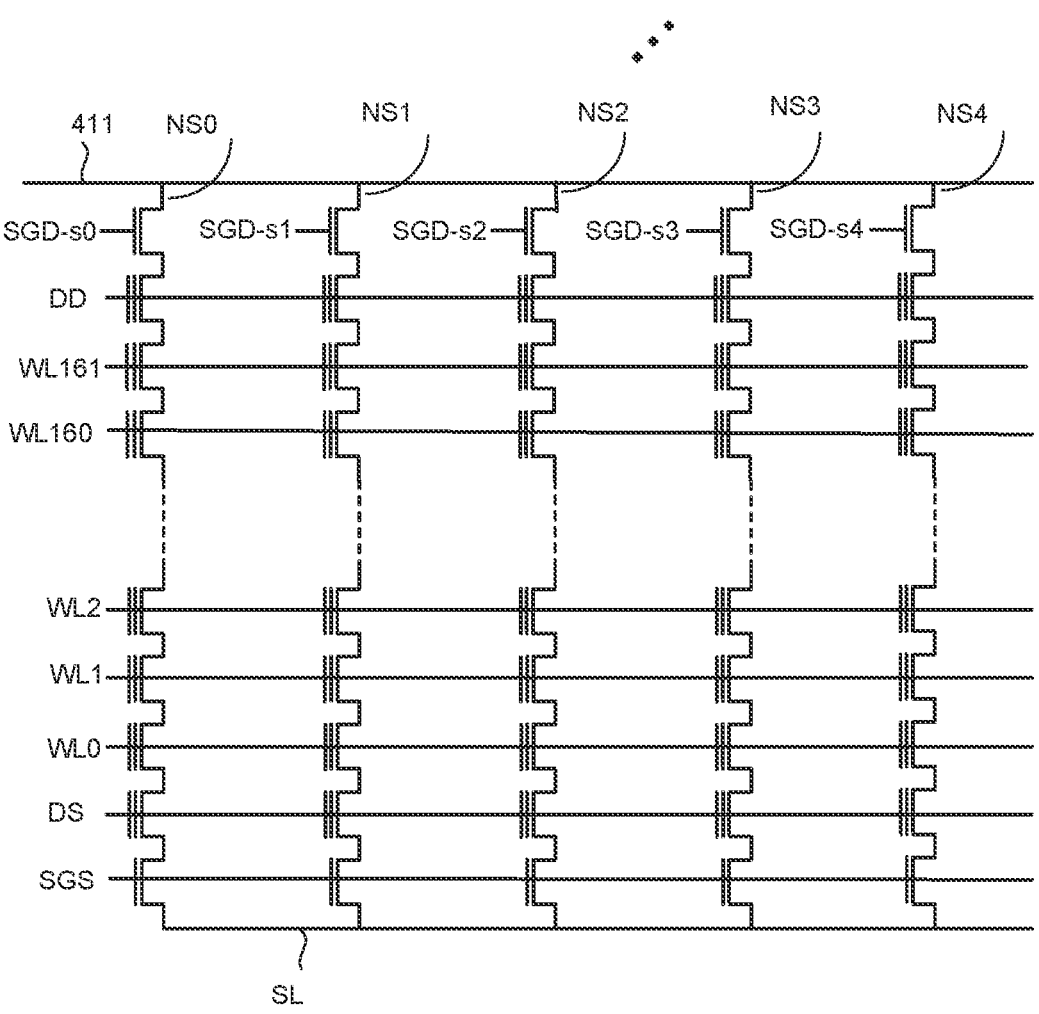
FIG. 4E is a schematic diagram of a portion of one embodiment of a block, depicting several NAND strings.

FIG. 4E is a schematic diagram of a portion of the memory depicted in FIGS. 4-4D. FIG. 4E shows physical word lines WL0-WL161 running across the entire block. The structure of FIG. 4E corresponds to portion 407 in Block 2 of FIGS. 4A-4B, including bit lines 411, 412, 413, 414, . . . 419. Within the block, each bit line is connected to five NAND strings. Drain side selection lines SGD-s0, SGD-s1, SGD-s2, SGD-s3 and SGD-s4 are used to determine which of the five NAND strings (NS0, NS1, NS2, NS3, NS4) connect to the associated bit line. Other NAND strings of the block and other bit lines are not depicted in FIG. 4E. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. There may be more or fewer than five sub-blocks in a block.

A source side selection line SGS connects/disconnects the NAND strings to/from the common source line. In some embodiments, there is a source side selection line for each sub-block (similar to the five SGD-s0, SGD-s1, SGD-s2, SGD-s3 and SGD-s4). The block can also be thought of as divided into five sub-blocks SB0, SB1, SB2, SB3, SB4. Sub-block SB0 corresponds to those vertical NAND strings controlled by SGD-s0, Sub-block SB1 corresponds to those vertical NAND strings controlled by SGD-s1, Sub-block SB2 corresponds to those vertical NAND strings controlled by SGD-s2, Sub-block SB3 corresponds to those vertical NAND strings controlled by SGD-s3, and Sub-block SB4 corresponds to those vertical NAND strings controlled by SGD-s4.

Although the example memories of FIGS. 4-4E are three dimensional memory structure that includes vertical NAND strings with charge-trapping material, other (2D and 3D) memory structures can also be used with the technology described herein.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

Figures 5A, 5B, 5C:
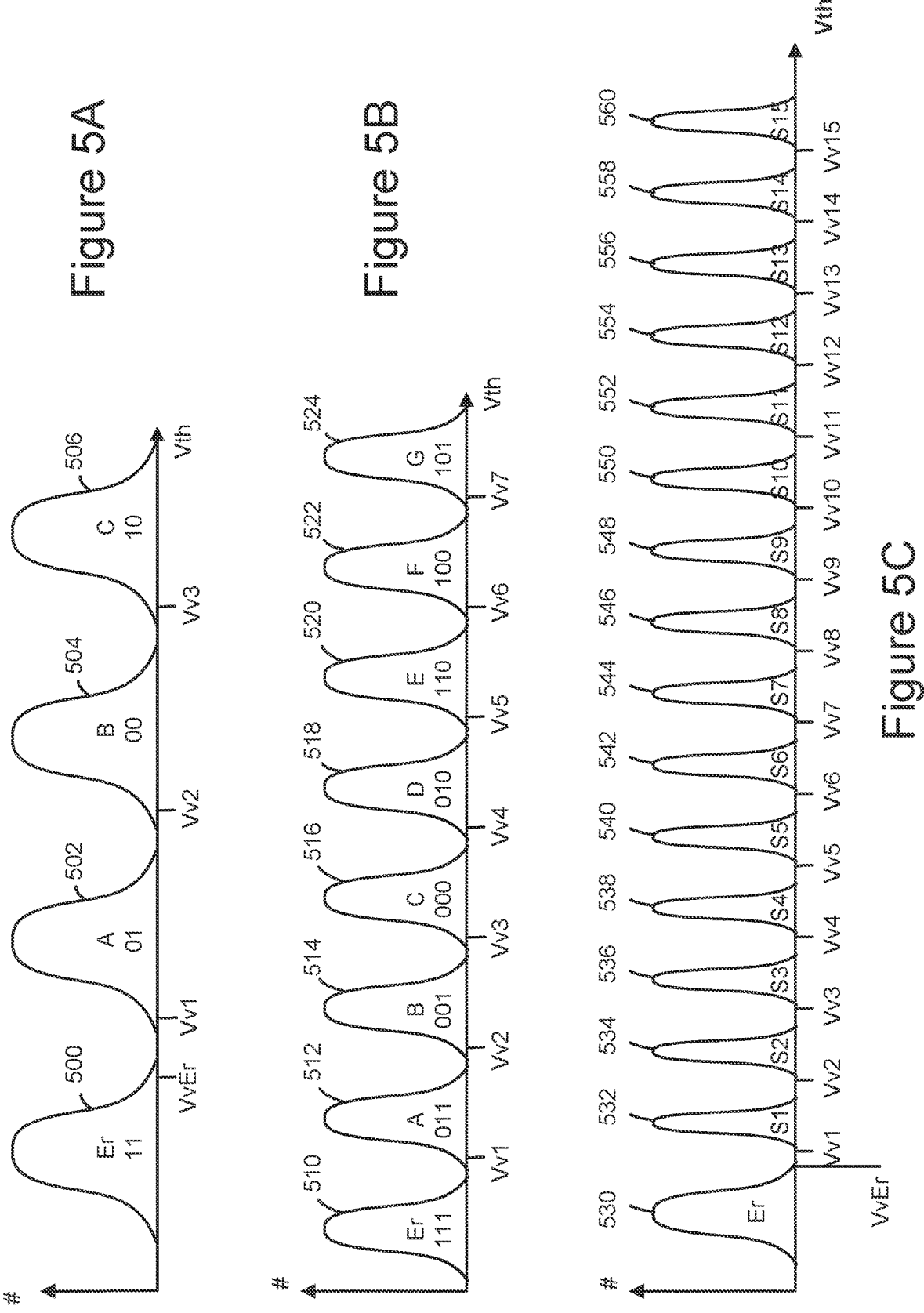
FIGS. 5A, 5B and 5C depict threshold voltage distributions.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions

532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110," "1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

Figure 6:
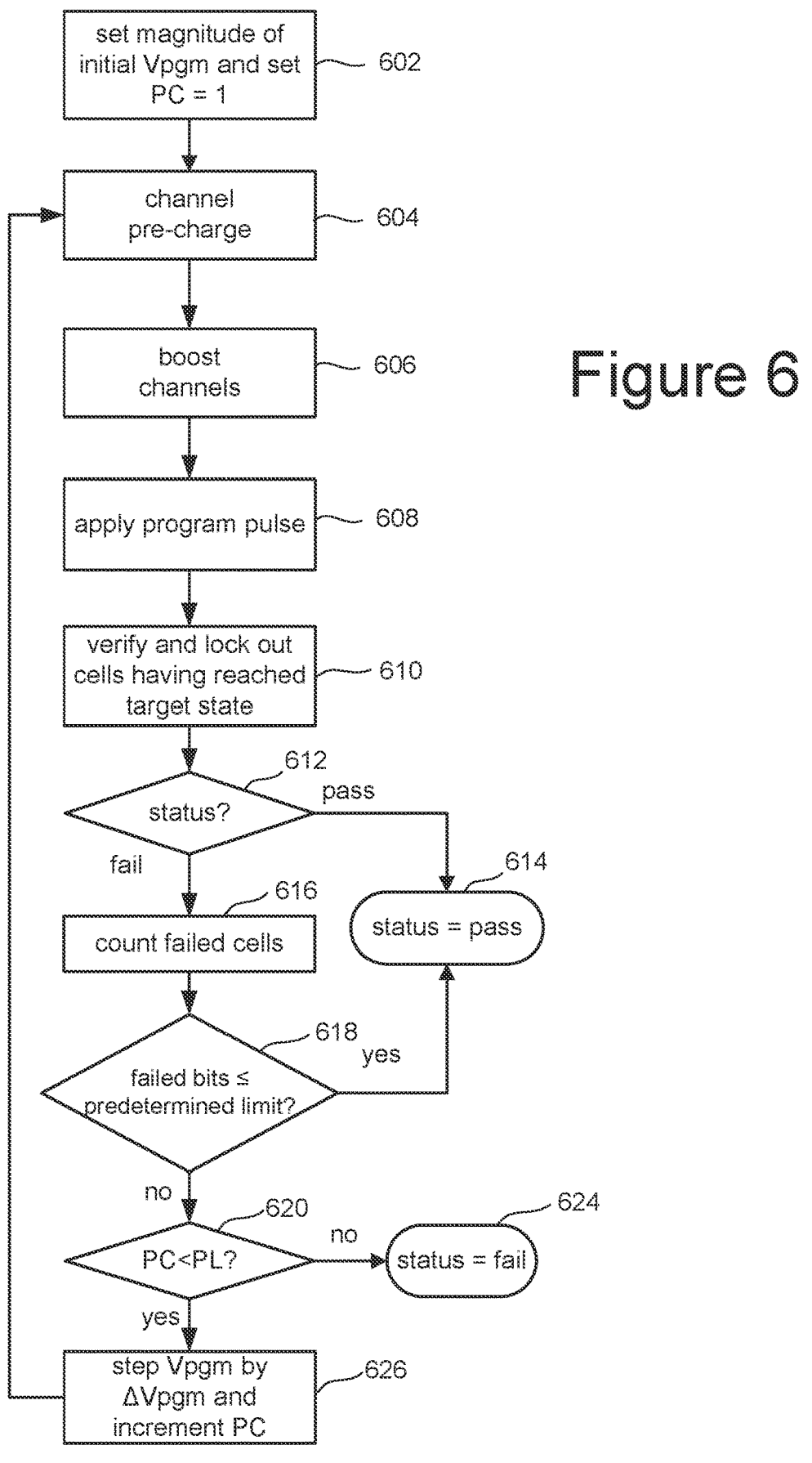
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage and is applied to the bit lines coupled with the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from states A-C to state Er of FIG. 5A, from states A-G to state Er of FIG. 5B, or from states S1-S15 to state Er of FIG. 5C.

3D NAND flash memory is widely used for storage and data transfer in consumer devices, enterprise systems and industrial applications because of its nonvolatility, affordability, high storage density and access speeds. 3D NAND memory's capacity has enlarged significantly as the vertical layers (number of word lines) of the array have increased in number and become thinner. Because of this, word line related defects present a major challenge in device development. The common method to counter word line related defects is a combination of stress and screen. Engineers use stress to make the defective points weaker and choose a proper screen to detect the defects and before the devices are passed on to the consumer. The selection of stress conditions is very important for the product screening since, if the defective parts of the memory array do not get enough stress, it may later become defective (often measured in defective parts per million, or DPPM) and make quality suffer. However, stressing the array can also be harmful since, if good parts were over stressed, they may be damaged and screened out, reducing yields and causing profits to suffer. Engineers will often invest a lot of resources on finding suitable stress conditions, as this can be a complex trade-off between quality control and yield. Since NAND memory has a complex hierarchy of die, plane, block, word line and so on, the variations within these different levels of hierarchy are complicated. The die-to-die variations and block-to-block variations make it even harder for engineers to decide on stress conditions. The following considers stress methods with die/block variations taken into consideration for better yield and DPPM of NAND memory die. Although the discussion is presented in the context of 3D NAND memory as described above, it can more generally applied to other memory technologies, such as MRAM or PCM, that can suffer from leakages from word lines or other control lines of the memory array.

Figures 7A, 7B:
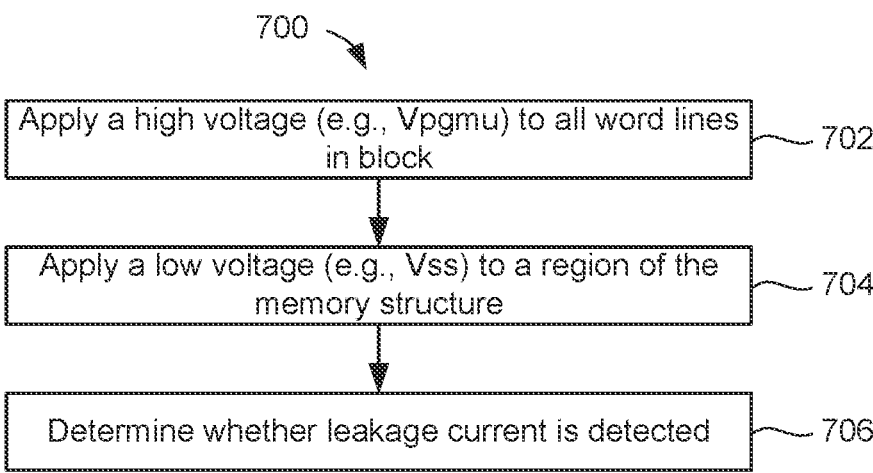
FIG. 7A is a flowchart of one embodiment of a process of determining whether a block of word lines contains a leaky word line.
FIG. 7B is a table that provides further details of voltages applied during an embodiment of the process of FIG. 7A.

To determine word line leakage, one or more of the word lines of a memory block or blocks are charged to a high stress voltage, such as a program voltage Vpgm, while other elements of the array are biased at a low voltage, such as Vss or 0V. The charged up word lines are then checked to see whether there is leakage current. Which word lines are biased at the stress voltage and what array elements are biased low depends on the test mode, where several test modes may be performed. The testing can be part of the test process performed on memory die before they are shipped out for customer use or, in other cases, such tests can also be formed once the memory die is in use. For example, leaky word lines may be detected during a built-in self-test (BIST). The specific type of test modes performed will depend on the specifics of the memory die, but for some examples in the 3D NAND memory example are tests for word line to memory hole leakage, word line to word line leakage, and word line to local interconnect leakage. Additionally, the test can be performed at different level of granularity, such as at the die level, block level, sub-block level, or word line level. FIGS. 7A and 7B consider an example of a block level leakage test.

FIG. 7A is a flowchart of one embodiment of a process 700 for determining whether a block of word lines contains a leaky word line. Step 702 includes applying a high voltage (e.g., Vpgmu) to all word lines in the block. Note that the program voltage used during program operations may vary depending on the program loop. The voltage Vpgmu may be the highest of these program voltages, or even higher than the highest program voltage typically used during a program operation. As one example, Vpgmu could be 25V. However, Vpgmu could be higher or lower than 25V. In one embodiment, the system control logic 200, including the state machine 262, instructs the control gate decoder of row control circuitry 220 to apply the high voltage to all word lines in the block. Step 704 includes applying a low voltage to a region of the memory structure. In one embodiment, the low voltage is applied to a source line in order to test for a word line to source line short. In one embodiment, the low voltage is applied to a bit line in order to test for a word line to memory hole short. In one embodiment, the low voltage is applied to both the bit line and the source line to test for either a word line to memory hole short or a word line to source line short. Step 706 includes determining whether a leakage current is detected. In one embodiment, leakage current a detection circuit such as described below with respect to FIGS. 13-16 monitoring for a leakage current. In one embodiment, a leakage current may flow if there is a short circuit between any of the word lines in the block and the source line. In one embodiment, a leakage current may flow if there is a short circuit between any of the word lines in the block and the memory hole (e.g., the NAND string channel). Embodiments for leakage detection are discussed in more detail below.

FIG. 7B is a table that provides further details of voltages applied during an embodiment of the process 700. A high voltage (e.g., Vpgmu) is applied to all of the data word lines in this example, but a lower voltage (e.g., Vpass) may be applied to all of the dummy word lines. The data word lines in FIG. 7B are WL0 to WL80 in the lower tier and WL81 to WL161 in the upper tier. The dummy word lines in FIG. 7B include one or more source side dummy WLs (DS), a dummy word line adjacent to the IF at the top of the lower tier (WLIFDL), a dummy word line adjacent to the IF at the bottom of the upper tier (WLIFDU), and one or more drain side dummy WLs (DD). A low voltage (e.g., Vss or 0V) is applied to both the bit lines (BL) and the source line (SL). The bit lines and the source line are examples of conductive lines connected to ends of the NAND strings. The voltage Vsgd applied to the one or more SGD line may be a select voltage that turns on the drain side select gates. The voltage Vsgs applied to the one or more SGS line may be a select voltage that turns on the source side select gates. In one embodiment, the voltages that are applied as depicted in FIG. 7B will result in a high voltage on the word lines and a low voltage on the NAND channel of the memory hole to test for a word line to memory hole short circuit. In one embodiment, the voltages that are applied as depicted in FIG. 7B will result in a high voltage on the word lines and a low voltage on the source line to test for a word line to LI short circuit. In a test embodiment where only one or a sub-set of the word lines are biased with the stress voltage for testing, the non-stress selected word lines can be biased at Vpass.

Figure 8:
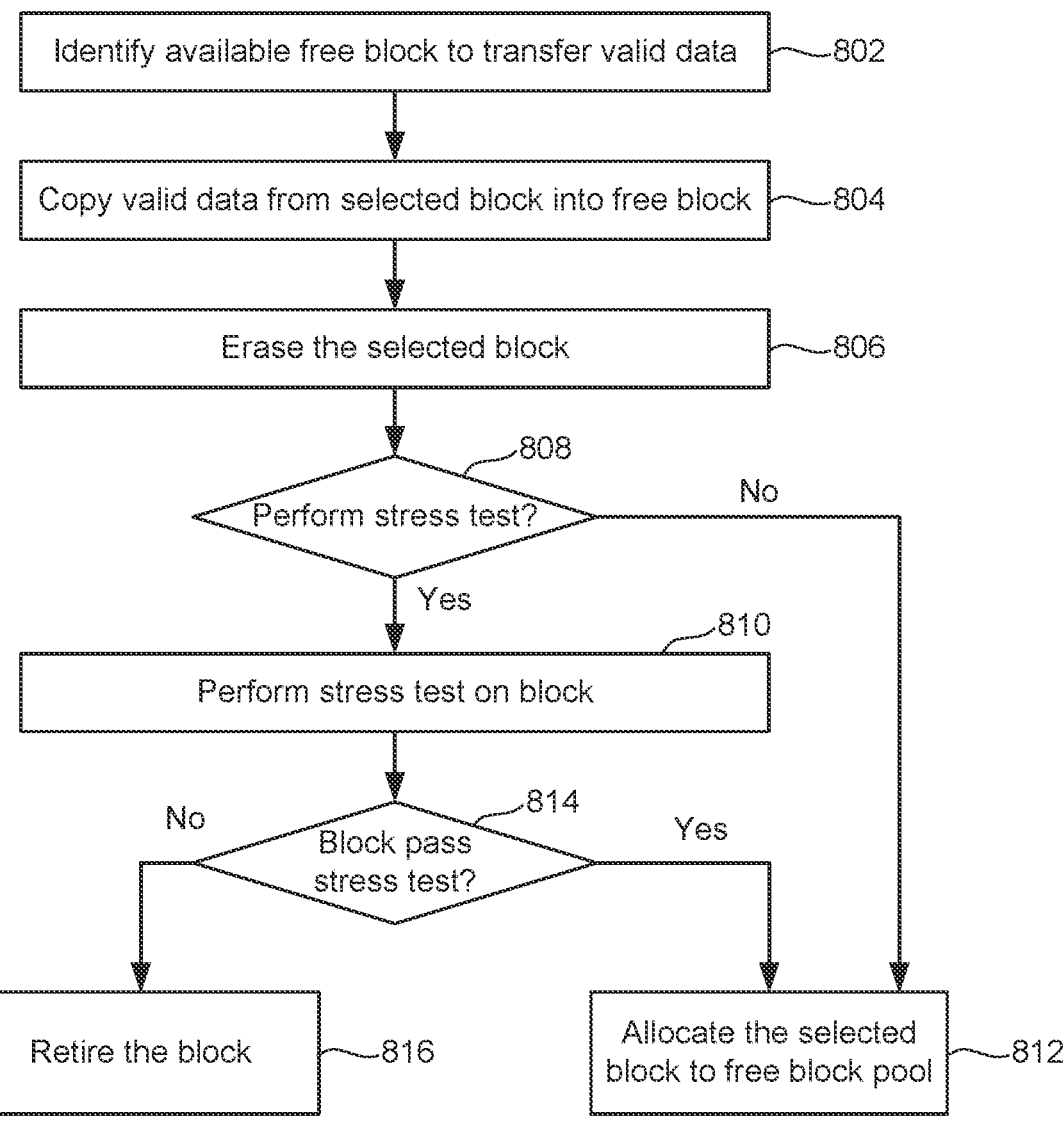
FIG. 8 is a flowchart of one embodiment of a process of detecting grown bad blocks in a non-volatile storage system.

As noted, testing for word line leakage can be performed as part of die sort testing before devices are shipped, be performed by the control circuitry of memory die 200 or control die 211, or both. FIG. 8 looks at an embodiment of incorporating a built-in self-test for detecting grown defects (i.e., defects that develop after the device is in use) into memory operation.

FIG. 8 is a flowchart of one embodiment of a process 800 of detecting grown bad blocks in a non-volatile storage system. The process 800 may be performed by one or more control circuits in the storage system 100. Process 800 describes detecting grown bad blocks in the context of garbage collection. Garbage collection may include data compaction in which valid data from one or more source blocks is copied to one or more destination blocks. A source block may be identified for data compaction when the amount of valid data falls below a threshold percentage. Note that detecting grown bad blocks can be performed without garbage collection. In an alternative embodiment, detecting grown bad blocks is performed in response to a special command sequence. For example, the memory controller 120 could issue a command sequence to the die (memory die 200, control die 211) to detect grown bad blocks.

Step 802 includes identifying an available free block to transfer valid data. In an embodiment, the memory controller 120 identifies one or more free blocks in the storage 130. Step 804 includes copying valid data from a selected block to the free block. This copying may include data compaction. Step 806 includes erasing the selected block after the valid data has been successfully transferred. At this time a stress test may be performed on the selected block. However, the stress test is not necessarily performed each time that the selected block is erased. In one embodiment, the stress test is performed once each n program/erase cycles. The value of n could be, for example, 10, 20, or some other value. If the stress test is not to be performed (step 808 is no), then the selected block is allocated to a free block pool in step 812. Alternatively, the stress test may be performed in step 810, where this can be as described with respect to FIGS. 7A and 7B. The stress test may accelerate stressful conditions on the memory cells and thereby provide for early detection of grown bad blocks. Moreover, the number of grown bad blocks that escape detection is kept low. Step 814 includes a determination of whether the block passes the stress test. If the block passes the stress test, then the block is allocated to the free block pool in step 812. If the block fails the stress test, then the block is retired in step 816. The block may be retired by adding the block to a list of grown bad blocks. In an embodiment, the memory controller 120 maintains the list of free blocks and grown bad blocks.

Although the techniques presented in the following can be applied to testing for word line leakage once a memory die is in use with a customer, the discussion will primarily be presented in the context of pre-shipping testing, such as performed at die sort testing when defective devices can be weeded out. Traditionally, there are two main ways of applying word line stress for such tests, as illustrated by FIGS. 9 and 10.

Figure 9:
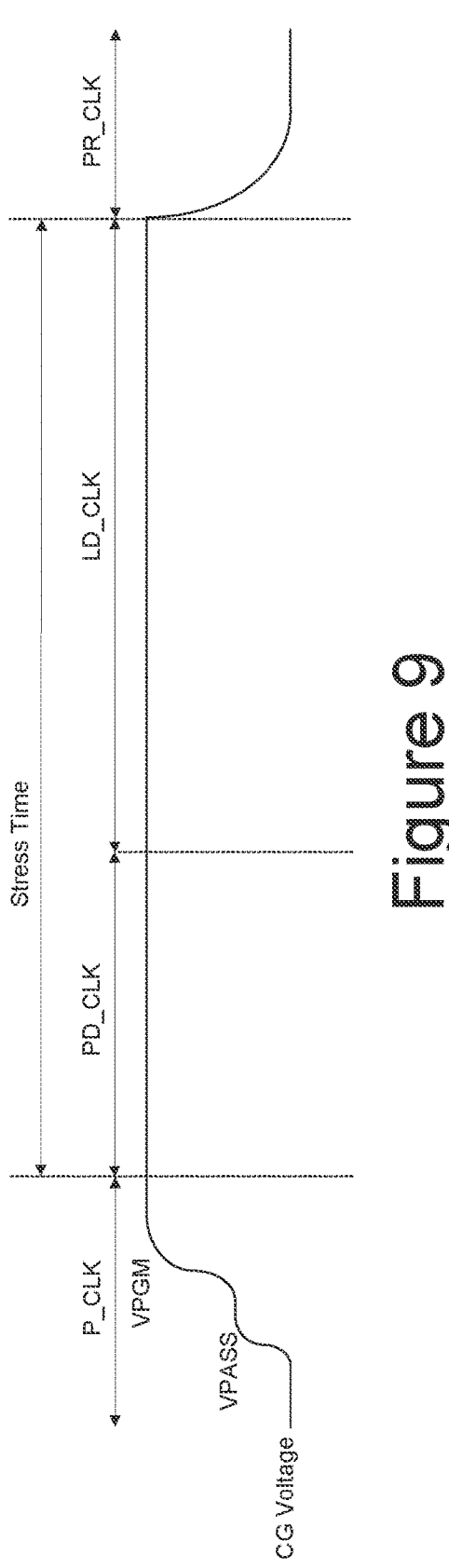
FIGS. 9 and 10 respectively present embodiments for stress-selected word line stress voltage levels using a clock count based word line leakage detection method and a manual program based word line leakage detection method.
Figure 10:
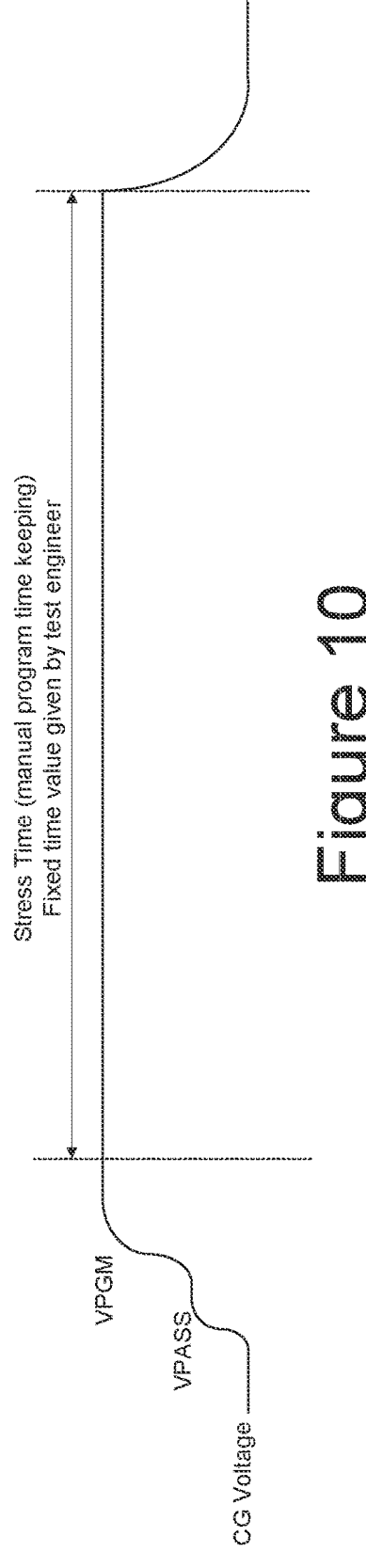

FIGS. 9 and 10 respectively present embodiments for stress-selected word line stress voltage levels using a clock count based word line leakage detection method and a manual program based word line leakage detection method. In both cases, the stress selected word line can be all of the word lines of a block or blocks, a single word line, or a sub-set of a block's word lines. For example, in a word line to memory hole or word line to local interconnect (LI) test mode, all of the word lines (or non-dummy word lines) may be selected, while in a word line to word line leakage test mode even word lines may be set to the high stress voltage level and odd word lines set to a low voltage (or vice versa). In both cases, the shown embodiments ramp up the control gate voltages on the word lines to the intermediate Vpass voltage at the same time that the dummy word lines, non-stress selected data word lines, and control gate lines are ramped up, before then further ramping up to a program voltage level. This higher word line voltage can be the Vpgmu as discussed above or other stress level.

Considering the manual program method of FIG. 10, at test time a manual program command can apply the stress voltage for a fixed stress time on all selected word lines, where this can be at the die, block, sub-block, or word line level. The stress time can be specified by a test engineer. Although this allows the stress to be specified, the stress time and amplitude values will typically be the same across all dies and blocks, such as established as part of device characterization, but would be impractical to vary from die to die or block to block as test time, given the extremely large number of dies and blocks per die.

In a clock count method for wore line leak detection as illustrated in FIG. 9, a fixed stress time is applied to all selected die/block/word lines based a leak detection clock value LD_CLK, that can be added in the other programming sub-clocks. In this example, an initial programing clock P_CLK is for the ramp up period, a clock PD_CLK for program pulse duration, then the additional stress time LD_CLK, followed by the verify (or program read) clock PR_CLK when the waveform ramps down. The total stress time is the combined clocks PD_CLK and LD_CLK. The duration of these clocks can be configured by setting the related parameters that can be determined as part of device characterization and stored in storage 266 of system control logic 260.

The word line stress methods illustrated with respect to FIGS. 9 and 10 will apply the same stress time on every die/block; however, determining the stress levels can be delicate. Applying weaker stress values can result in higher yields, but at the cost of more defective parts, such as measure in DPPM. Higher stress values will decrease DPPM values, but at the cost of a yield penalty. Additionally, if the stress levels are too high, this can degrade devices that would otherwise be fine, resulting in worse values for both yield and DPPM. Determining suitable stress conditions under the method illustrated with respect to FIGS. 9 and 10 is consequently a tradeoff between yield and DPPM, with a high yield loss penalty having to be paid in order to achieve a low DPPM specification.

Figure 11A:
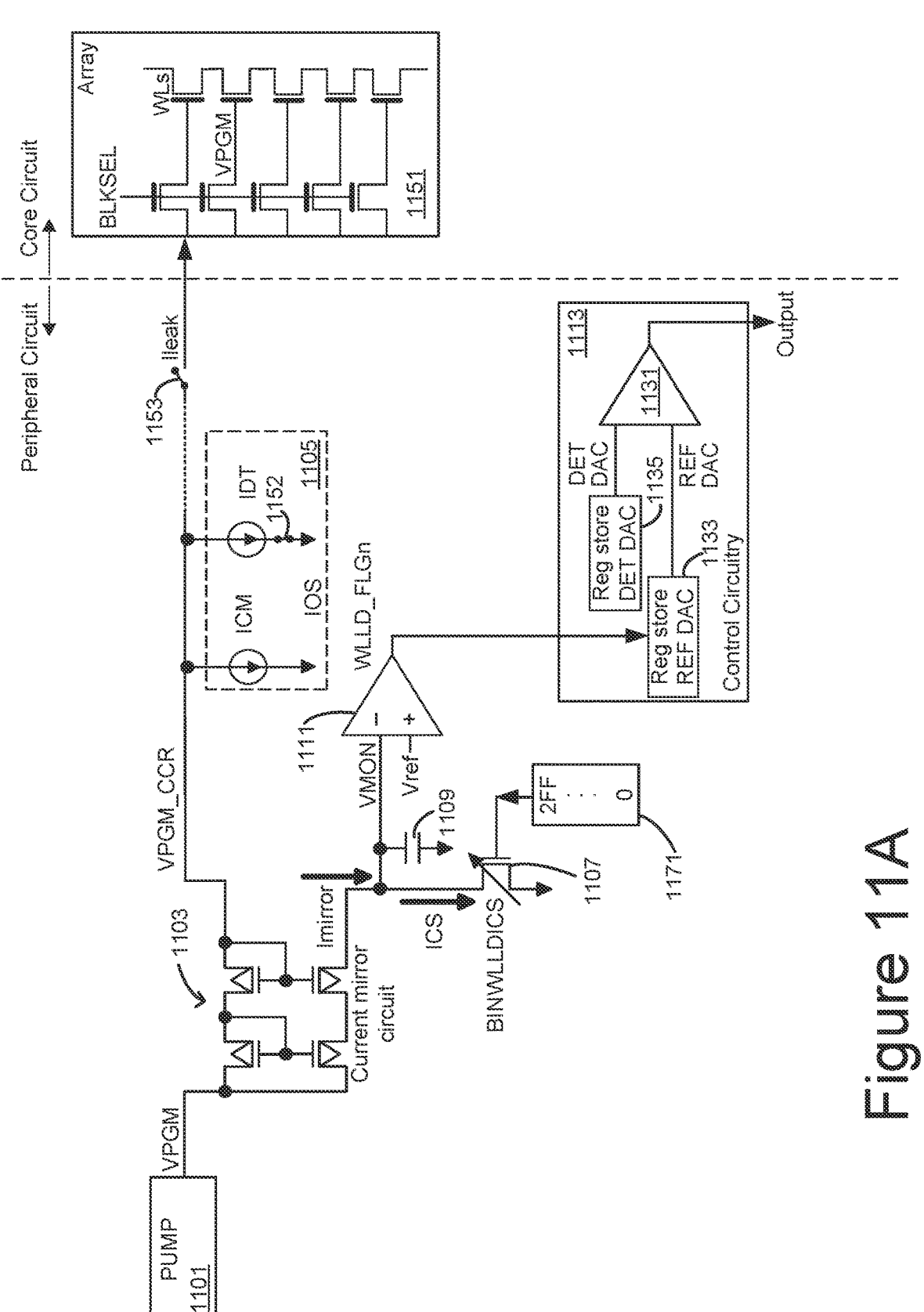
FIGS. 11A, 11B, and 12 are respectively embodiments of a schematic representation of a circuit to detect word line leakage and a set of waveforms for the circuit.
Figure 11B:
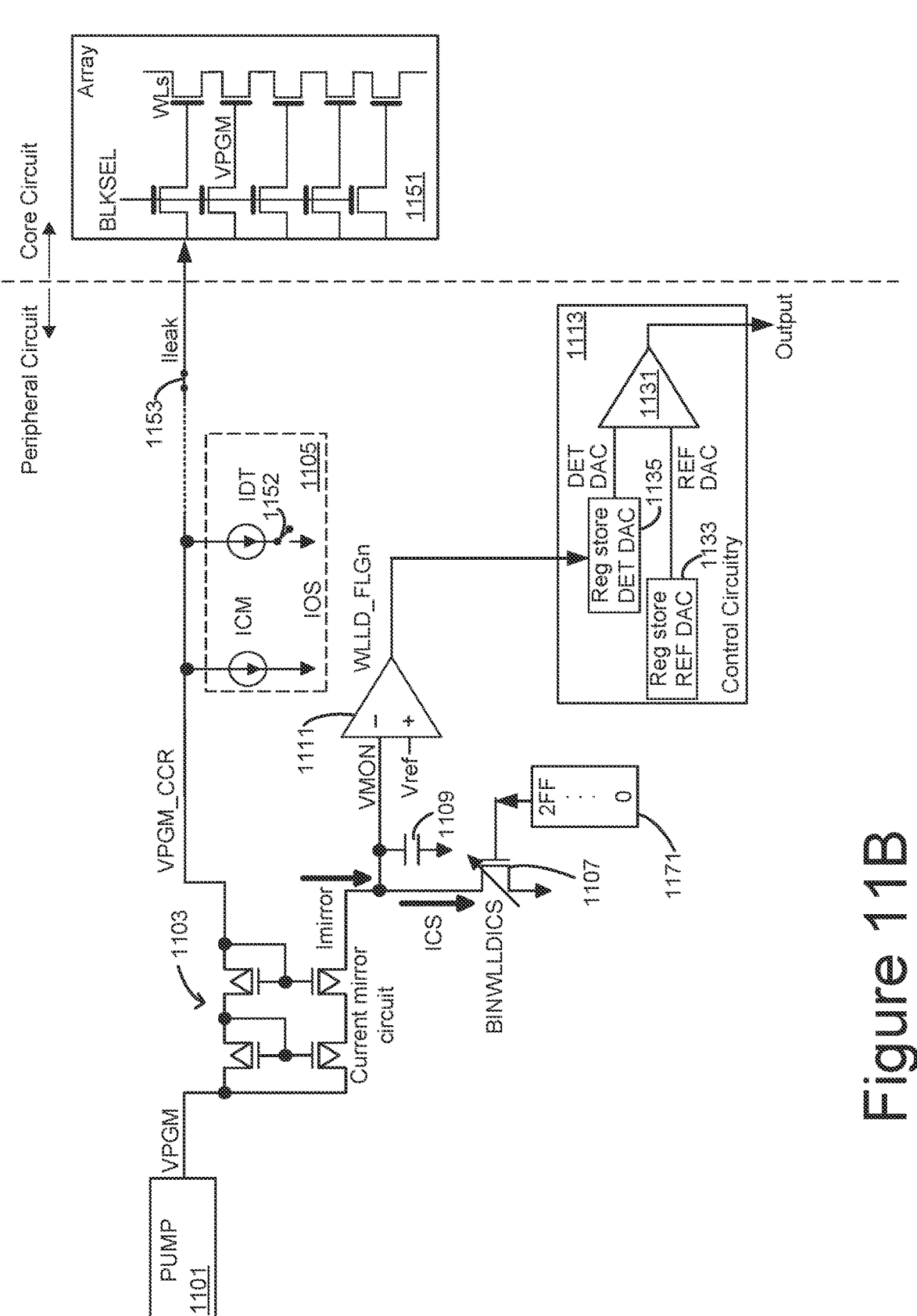
Figure 12:
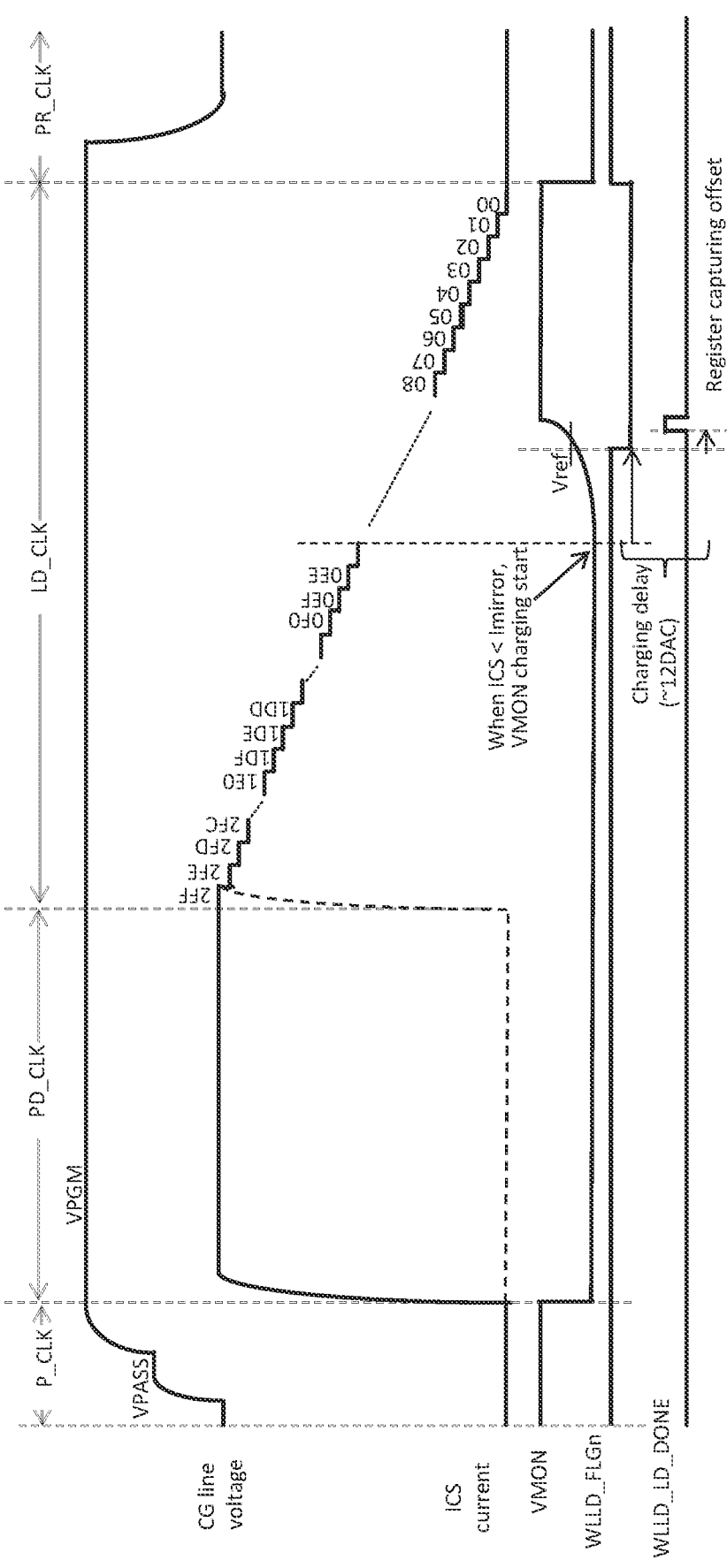

FIGS. 11A, 11B and 12 are respectively embodiments of a schematic representation of a circuit to detect word line leakage and a set of waveforms for the circuit. The elements of FIGS. 11A, 11B include an array 1151 that is part of the core circuit of the memory, such as part of memory structure 202, and the peripheral circuit, such as control circuit 211 or the control circuit elements of the memory die 200. The array 1151 is represented schematically as a portion of a NAND string whose elements are connected along word lines through block select (BLKSEL) switches to receive voltage levels, such as the program voltage VPGM used during stress as shown on one of the word lines, from the peripheral circuit. (Here the block select switches are shown as part of array 1151, but in other cases for a control die/memory die embodiment as in FIG. 2B they can be part of control die 211.) On the peripheral circuit, a charge pump 1101 can generate VPGM or other stress voltage that can then be applied by way of the decoding circuitry (not shown) to the array 1151. The additional elements shown for the peripheral circuit include elements representing the various contributions to the current and elements to determine whether the array has excessive word line leakage.

To determine word line leakage, VPGM or other stress voltage can be applied to the array 1151 from the charge pump 1101 to the selected word lines for a stress interval as described with respect to FIGS. 7A-10. The leakage current Ileak due to word line leakage from the array or arrays will be one of the sinks drawing off current from the voltage level being generated by charge pump 1101. These other currents are represented in the offset current block IOS 1105, including current sources for a common mode current ICM that will be the amount of current normally drawn in device operation and a detection current IDT that will be used by the device during leak detection by the leak detection circuitry to determine a baseline leakage, but that is not part of the word line leakage. For example, the current IDT would include the other peripheral circuit element that are used for leakage detection and only activated during a word line leakage test to determine a baseline leakage when the array is not defective.

With respect to the elements that are added circuitry to determine Ileak, rather than measure Ileak directly, a current mirror circuit is used to generate a current Imirror that will be proportional to the current due to IOS 1105 and Ileak, but can be of a lower amplitude. For the main leg of the mirror a pair of diode connected transistors (PMOSs in this embodiment) are connected to receive the pump voltage VPGM_CCR to the array. The control gate of each of the diode connected transistors are connected to the control gate of a corresponding transistor in the mirroring leg, which provides the mirrored current Imirror. The relative current amplitudes between the two legs corresponds to the relative sizing of the transistors in the two legs, allowing for a relatively small, but proportional, Imirror value to be used.

The current mirror 1103 supplies the mirror current Imirror to a node that connects to a first input (here the—node) of comparator 1111 at a voltage level VMON, where the other input of comparator 1111 (here +) is connected to receive a reference voltage Vref. A capacitor 1109 that can accumulate the charge supplied from Imirror is also connected to the node of the—input of comparator 1111. Also attached at the node connected to the—input of the comparator 1111 is an adjustable current source BINWLLDICS 1107 that drains current off of the upper plate of the capacitor 1109 to ground by the current ICS. In this embodiment, BINWLLDICS 1107 is implemented as a DAC (digital to analog converter) with values running from 2FF to 0 from ICS control circuitry 1171 to receive the input that is then applied as a gate voltage to BINWLLDICS 1107 to generate the corresponding ICS value. The control circuitry 1113 can be part of the system control logic 260. The control circuitry 1113 also receives the output WLLD_FLGn of comparator 1111 that, as explained in more detail with respect to FIG. 12, acts as a leak detection flag.

The control circuitry 1113 will also include registers 1133 and 1135 to respectively hold the determined parameter values for the baseline and the leak detection operation and logic circuitry such as comparator 1131 to perform the comparison between the baseline and the leak detection operation parameter used to determine whether the Ileak value indicates a defective device. The control circuitry 1113 can also control (connection not shown) the switches 1152 and 1153 for use to determine baseline and leakage current values.

FIG. 11A illustrates the switches configured to determine a baseline reference value for current, with switch 1152 closed and switch 1153 open. This disconnects the array 1151 from the detection circuitry and connects the detection current IDT. The current ICS is decreased incrementally from the 2FF DAC value to 0, until the flag WLLD_FLGn flips and the corresponding DAC value saved in the register Reg store REF DAC 1133 to provide the base line REF DAC value.

FIG. 11B illustrates the switches configured to determine the leakage current Ileak value for the array 1151, with switch 1152 open and switch 1153 closed. This disconnects the current IDT from the detection circuitry and connects the array 1151. The current ICS is decreased incrementally from the 2FF DAC value to 0, until the flag WLLD_FLGn flips and the corresponding DAC value saved in the register Reg store DET DAC 1135 to provide the detected leakage DET DAC value. The reference value REF DAC and leakage value DET DAC in comparator 1131, to provide an output that used to determine the amount of leakage from the array in response to a stress mode.

FIG. 12 illustrates some of the waveforms for the circuitry of FIGS. 11A and 11B in a leak detection process. At top is shown the control gate voltage levels, similarly to that seen in FIG. 10. Relative to FIG. 10, the additional leak detection stress clock time (LD_CLK) and, consequently, the time that VPGM voltage is applied is less. Below the CG Voltage waveform is the ICS level, the voltage VMON on the first input of the comparator 1111, and the output WLLD_FLGn of the comparator 1111 that is then captured for the register 1133 or 1135.

During a baseline or leak detection mode, the pump 1101 will supply the high stress voltage to the selected word lines of the array 1151 with the switches 1152 and 1153 set accordingly. The current drawn, including the leak current Ileak to the array 1151 in detection mode, will be mirrored to the detection module by a current mirror circuit 1103. The ICS value from the ICS control circuit starts high, corresponding to the highest digital value of 2FF for this embodiment the current source BINWLLDICS 1107, and stays at the high value during the PD_CLK duration. The VMON level is initially high before ICS starts at its high level, but once ICS is on at the 2FF level VMON is taken low. The output of the comparator 1111 of WLLD_FLGn is initially high. After the initial stress during the PD_CLK phase, in the LD_CLK phase ICS is decreased a step at a time as the digital value of BINWLLDICS decreases once leak detection starts. Once ICS drops to less than Imirror, Vmon will start to charge up. After a few more further DAC steps, Vmon will continue to be charged up, eventually becoming larger than Vref, thus making the WLLD_FLGn flip and the control circuitry will record the DAC value which represents the level of Imirror, in turn allowing determination of Ileak.

The performance of a memory product is largely estimated by two critical factors: the amount of time required to write the data into the memory cells, also known as tPROG; and the amount of time it takes to read the content stored inside the memory cells, also known as tREAD. In memory devices, such as the NAND Flash memory embodiments described above, both these factors are largely dependent on the amount of time it takes for the word lines of a selected memory block to ramp-up and settle to the required voltage bias level. Among the factors that limit word line settling times are the following factors: the amount of capacitive load seen by a word line; the RC delay that arise due to on-chip signal routing; delays arising from the turn-on times of switches and different analog multiplexing circuitry in the decoding and supply circuits; and the strength of the voltage pump and related circuits that are involved in driving the word line to the required voltage level. The following presents embodiments to reduce two of these factors, namely RC delay in the overall signal path and delay due to the turn on times of switches and multiplexers, thereby speeding up the word line ramp-up process and providing overall operation-based performance improvement.

In NAND memory, the most significant component that contributes to an operation's performance is typically the unselected word line ramp-up and settling time. Generally, across multiple operations such as read, refresh read, preprogram, soft program, leak detect operations, and so on, the unselected word lines are biased to a VUSEL voltage level. During non-user operations (i.e., not the user access operations of user read or user write) such as refresh read, soft program, pre-program and leak detect operations all the word lines of a memory block remains unselected and all the word lines ramp-up to VUSEL voltage. An overall operational performance improvement can be achieved by reducing the clock timings associated with these operations. To gain operational performance by reducing the clock timings, the unselected word line ramp-up to VUSEL level can be sped up. This can be done by decreasing overall path resistance from the corresponding system voltage pump to the word line connection.

Figure 13:
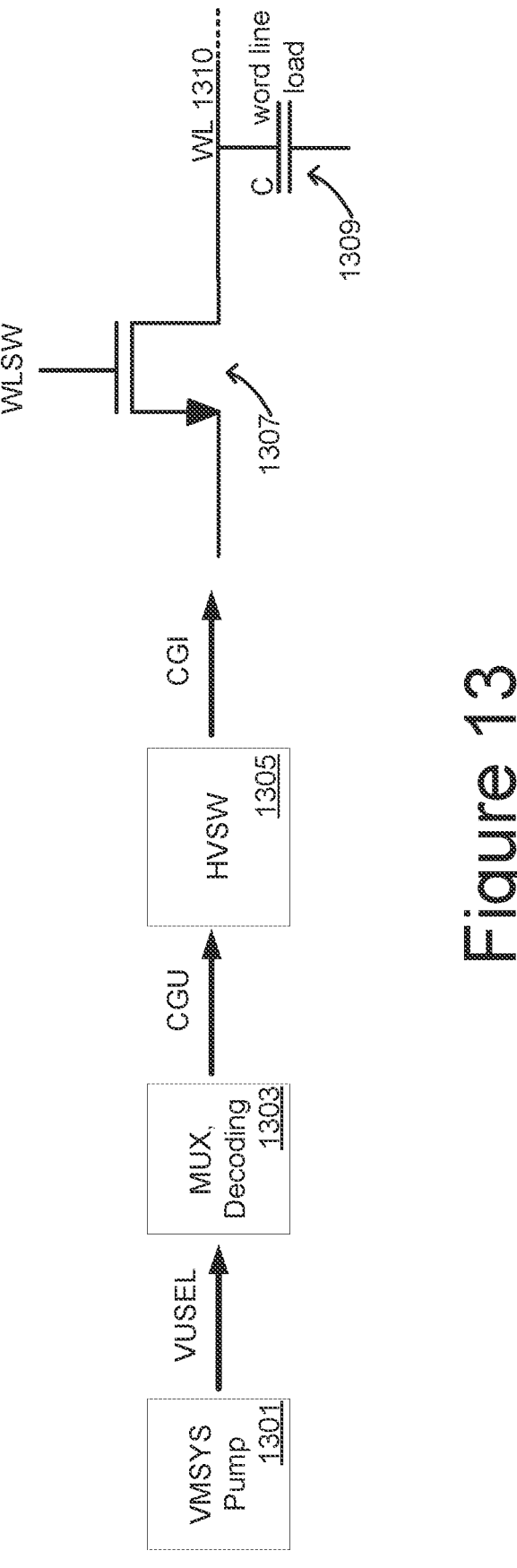
FIG. 13 is a block diagram to illustrate an embodiment for some of the circuitry to bias word lines at an unselected word line bias voltage.

FIG. 13 is a block diagram to illustrate an embodiment for some of the circuitry to bias word lines at an unselected word line bias voltage. To bias the control gates of the word lines to a VUSEL voltage, the respective VUSEL supply is generated by a charge pump system VMSYS 1301 generator, which can be considered part of the power control 264 section the memory device's control circuitry. After starting at the VMSYS pump 1301, the voltage path then passes through decoding circuitry and analog multiplexing circuits 1303 for a first level of decoding to generate a signal CGU, which is then further decoded by high voltage switches HVSW 1305 to generate a signal CGI. The specifics of the decoding will vary depending on the embodiment, but the CGI may be common to the word lines of one or more blocks and could be on the order of hundreds of word lines. The individual word lines are connected to receive the CGI level through a word line switch WLSW 1307. The word lines will each have a capacitive load represented as the capacitance 1309.

Figure 14:
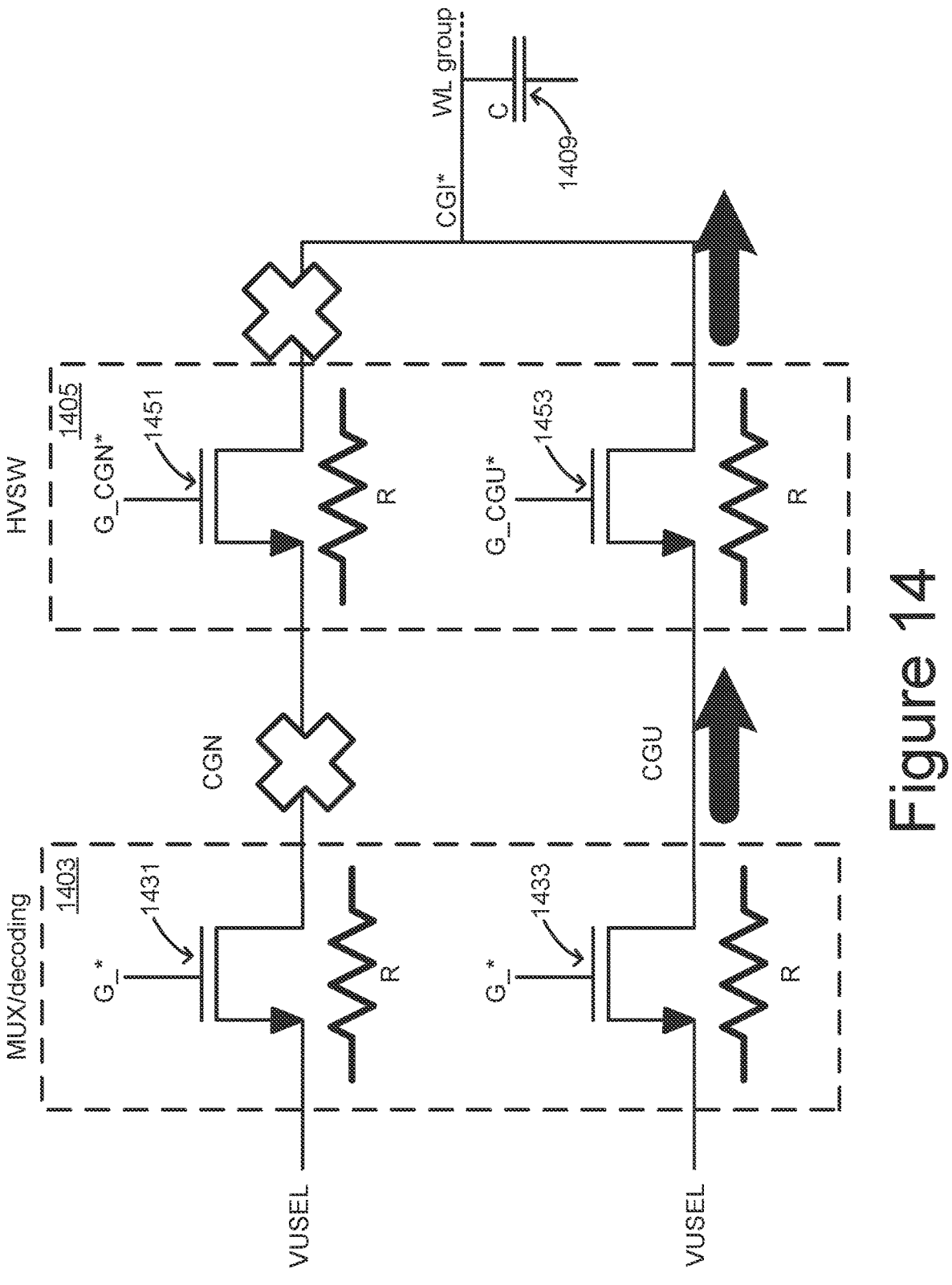
FIG. 14 is a schematic representation of some of the elements of an embodiment of the word line supply and decoding circuitry with separate paths for the selected word lines and the unselected word lines.

Along the signal path from the pump system VMSYS 1301 to the actual word line connection, the total word line ramp-up and settling time depends on the actual word line load 1309, VMSYS pump 1301 strength and the total path and switching delay from pump to word line position. Since the actual word line load depends on the processing criterion and the voltage pump strength is dependent on chip area and device current (Icc) specification, the factors that can be improved to achieve better performance include decreasing the path/switching delay. More detail on an example of the path and switching delay components for the VUSEL signal from the VMSYS pump 1301 to word line 1310 WL is shown in FIG. 14. On its path to bias unselected word lines, the VUSEL voltage passes through two levels of multiplexing/decoding, first at MUX/decoding 1303 and then at HVSW 1305, that each contain a set of switches (also known as drivers) that provides the bias levels to word lines.

In an example implementation, the VUSEL voltage reaches a first level of multiplexing/decoding 1303 that can have two paths/drivers for VUSEL transfer, a CGN path to supply selected word lines (e.g., a read or program selected word line) and a CGU to supply the unselected word lines of a NAND block. This illustrated in FIG. 14.

FIG. 14 is a schematic representation of some of the elements of an embodiment of the word line supply and decoding circuitry with separate paths for the selected word lines and the unselected word lines. The MUX/decoding block 1403 is represented by two switches, 1431, to receive VUSEL and provide this to the selected word line path as CGN, and 1433, to receive VUSEL and provide this to the unselected word line path as CGU. Each of the two paths may have a number switches for the different levels of decoding, that are here represented by 1431 and 1433, where the decoding control signals are here labelled as G_* at this level. The HVSW decoding/driver block 1405 follows and is again represented by two switches, 1451, to receive CGN and provide this to the word line supply line CGI*, and 1453, to receive CGU and provide this to the word line supply line CGI*, which has capacitive load C 1409 from its corresponding word line group. Each of the two paths may again have a number switches for the different levels of decoding, that are here represented by 1451 and 1453, which can receive the corresponding decoding control signals G_CGN* and G_CGU*. The switches 1431, 1433, 1451, 1453 need to be sufficiently high voltage devices to handle the supply levels they transmit and are here all taken to have the same resistance R, represented schematically by the resistor symbol under each of the switches.

In a typical implementation, the CGN path through switches 1431 and 1451 provide the bias to a selected set of word lines while the CGU provides through switches 1433 and 1453 bias the unselected set of word lines. This allows for the proper voltage levels to be provided to both a selected word line for a user data access operation such as a data read or user data write, while biasing the unselected word lines of a block to the unselected word line voltage such as read bypass or write bypass voltage. For non-user operations (where data is neither read out and transferred off of the memory device nor received from off the device and written in) such as refresh read, soft/pre-program, and leak detect modes, all the word lines of a block are biased at the same unselected word lines level during the initial clock signal. The biasing of the word lines that are unselected is by the CGU driver path drivers 1433 in MUX/decoding 1403. The CGN path drivers 1431 can remain OFF during this time for unselected word lines and are available for selected word lines. After the MUX/decoding block 1403, the next level of multiplexing happens at HVSW module 1405, where also the bias to unselected word lines is provided by the set of CGU switches 1453, while all of the CGN switches 1451 remain off during this time. This biasing arrangement of unselected word lines is represented schematically in FIG. 14 by the heavy X along the CGN path and the heavy arrow along the CGU path. After passing through the MUX/decoding module 1405, the CGU/CGN signal gets connected to respective CGI signals lines, which are responsible for driving the word line load capacitance represented at C 1409.

Referring back to FIG. 13, the total time delay for word lines to ramp-up is governed by the total path resistance from VMSYS pump 1301, through the switches illustrated in FIG. 14 along the word line connection path (CGU path), and on through WLSW 1307 to word lines 1310. The total load capacitance C 1309/1409 is that of the word lines 1310 of the CGI* group, where a group could be on the order of a thousand word lines. For the architecture and R/C values of FIG. 14, the timing delay for word line ramp-up would be (R+R)*C=2RC.

To address this issue, the following discussion presents techniques for improving performance of non-user operations, such as refresh read, pre-program, soft-program and leak detection, in all word lines of a block or set of blocks are biased at the same voltage (i.e., the unselected word line voltage) at the same time. For such operations, for at least an initial portion when all word lines are biased at the same level, rather than having some word lines selected and others unselected. In a first aspect, both the selected and unselected bias paths can be used concurrently to charge up the memory lines. In another set of aspects, the operation of level shifters within the supply chain can be modified to increase performance.

To improve the path resistance of VUSEL from VMSYS pump 1301 to the word line connections, in operation modes that do not use both CGN and CGU paths for differentially supplying selected and unselected word lines, the CGN path can be used concurrently with the CGU path. By turning on both of the CGN and CGU paths through MUX/decoding 1503 and HVSW 1505 concurrently in modes where only one of them would otherwise be used during word line ramp-up, performance can be improved for operations such as refresh read, soft program, pre-program, and leak detect operations during which all word lines ramp-up to the VUSEL level together.

To improve performance while still allowing for selected and unselected word lines to be independently biased, embodiments presented here have two modes for the word line decoding/driving circuitry. In a first mode, that can be used for operations such as user read and user writes the have both selected word lines and unselected word lines, the unselected word lines would use only the CGU decode path, as illustrated in FIG. 14, and the selected word lines would use only the CGN decode path. In a second mode, that can be used for operations when all of the word lines of a block receive the same bias level, such as for word line leakage tests, the word line group supply line CGI* is concurrently biased by both paths. This approach allows two parallel paths for CGI* and for the word lines to ramp-up to VUSEL voltage, instead of a single CGU path. This is illustrated with respect to FIG. 15.

Figure 15:
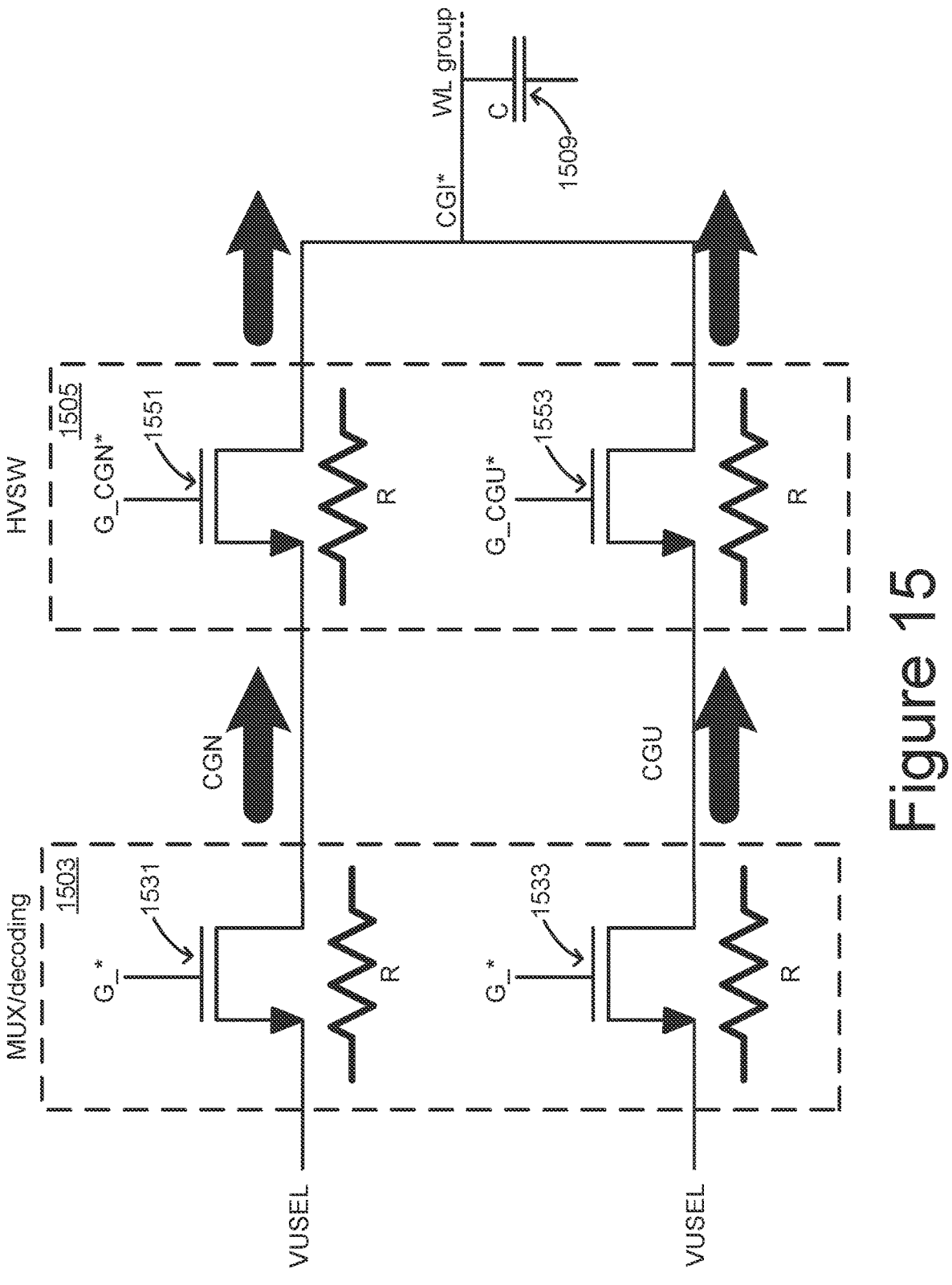
FIG. 15 is a schematic representation of an embodiment in which a word line group is biased in parallel by both the select word line and unselected word line decoding paths.

FIG. 15 is a schematic representation of an embodiment in which a word group is biased in parallel by both the select word line and unselected word line decoding paths. FIG. 15 is arranged as FIG. 14 and the elements are similarly numbered, but now shows the simultaneously turning ON of both the CGN and CGU path for CGI* to ramp-up a word line group supply line to the VUSEL voltage, as illustrated by the heavy arrows along each path. Along the CGU path, both of 1533 of MUX/decoding block 1503 and 1553 of HVSW block 1505 are again ON, but now both of 1531 of MUX/decoding block 1503 and 1551 of HXSW block 1505 are also ON. Although the capacitive load C 1509 of the word line group is the same, the effective path resistance becomes half (from 2R to R) by turning on both the paths simultaneously, thereby, the effective time delay decreases from 2RC to RC.

In one set of embodiments, the simultaneous turning ON of both the CGN path and the CGU path can controlled by introducing a new one-bit parameter, here labelled "F_CGN_CGU_ON", that can be generated by the system control logic 260 and supplied to the word line driver and decoding circuitry based the command received from the non-volatile memory controller 120. The operational control of this parameter can as follows:

F_CGN_CGU_ON=0→ only CGU path turn ON; and
F_CGN_CGU_ON=1→ both CGN & CGU path ON simultaneously.

The settings related to F_CGN_CGU_ON=1 are applicable for operations that do not need to differentially bias selected word lines and unselected word lines of a selected block, such as refresh read, soft-program, pre-program, and leak detect operations. By operating in the mode of FIG. 15 by turning ON both CGN and CGU path simultaneously for such operations, in an example embodiment this can result in a time saving of ~25% form ramp-up times. The above discussion only is considering the CGU path supplying the unselected word lines by the CGU path when F_CGN_CGU_ON=0, but in this mode the selected word lines can be supplied by the CGN path.

Figure 16:
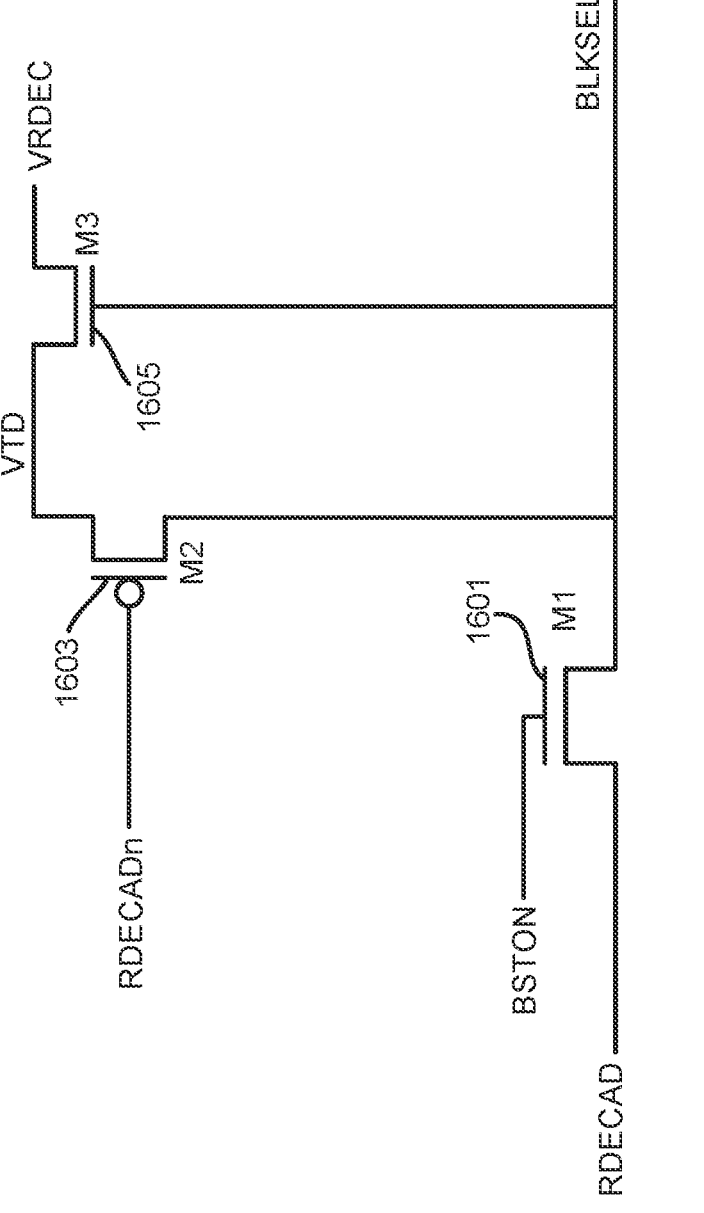
FIG. 16 illustrates an embodiment of a positive level shifter that can used for block decoding.

Another way in which performance can be improved is in obtaining faster switching speeds for the switches used to supply word lines. For example, referring back to FIG. 13, in addition to increasing the ramp-up speeds at the CGI line as discussed above, performance can also improve the speed with which the full ON voltage is applied to WLSW 1307. As such block selection switches need to pass high voltages, such as programming voltages, a level shifter is often used to raise the logic level for the control signal to a higher voltage that as actually applied to the control gate. FIG. 16 illustrates an example of such a block decode positive level shifter.

Figure 17:
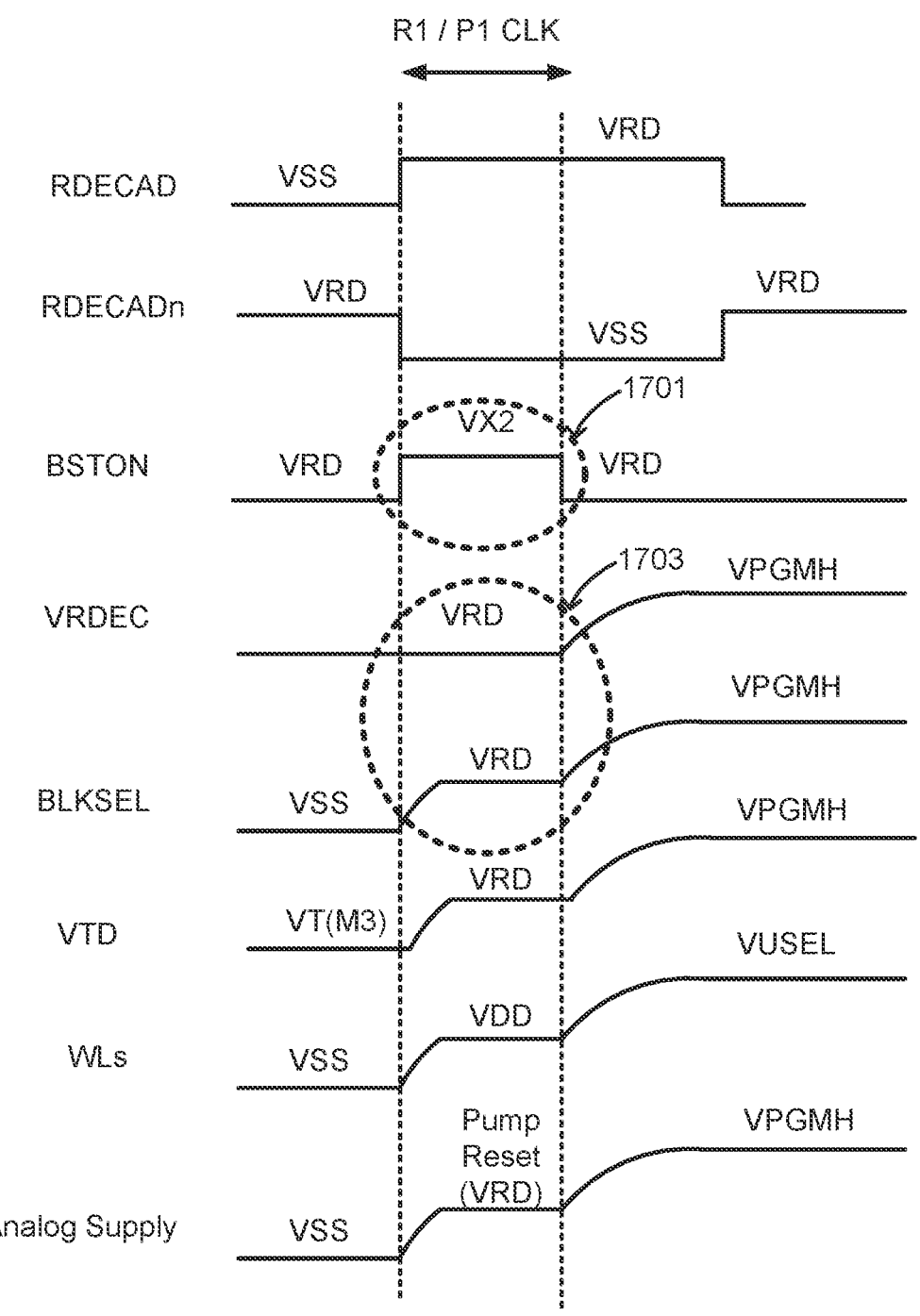

FIG. 16 illustrates an embodiment of a positive level shifter that can used for block decoding. The circuit is simplified to show the main features with, for example, body biases and well structure details not shown. The function of the circuit is supply the level VRDEC to the BLKSEL line in response to the control signal RDECAD being asserted. The decoding voltage level VRDEC can, for example, have a high level of a high programming voltage level VPGMH (e.g., 15-20V), while the RDECAD may be on the order of 2-3V. In this embodiment, the switch M1 1601 is an enhancement type NMOS, the switch M2 1603 is a high voltage PFET, and the switch M3 1605 is a depletion type NMOS. FIG. 17 illustrates a set of waveforms for turning on the level shifter of FIG. 16.

FIG. 17 is a set of waveforms for an embodiment of operating the level shifter of FIG. 16 with an initial pulse to facilitate turn on. Initially, the control signal RDECAD is not asserted and at VSS, its inverse RDECADn is at the high logic input value of VRD, the gate bias BSTON of M1 1601 is at VRD. Initially, VRDEC can be at VRD. With these levels, M1 1601 is on, PMOS M2 1603 is off, and BLKSEL will be at VSS. Consequently, the VTD level (between M2 1603 and M3 1605) will be at the threshold value the depletion NMOS M3 1605 of VT (M3), the word lines connected by way of the block select switch will be at VSS, and the analog supply level that will be supplying the word lines through the block select switch can be at VSS. At the start of a clock period R1/P1 CLK, such as at the initiation of a read or a program operation, RDECAD is asserted and goes to VRD, RDECADn with go to VSS and M2 1603 turns on, while BSTON is raised to a level VX2, as indicated at 1701. Consequently, M1 1601 transfers VRD to BLKSEL as indicated at 1703, which is then applied to the gate of M3 1605 to raise VTD to VRD from the VRDEC input. Consequently, all of the circuit lines to the right of M1 1601 are at VRD. The analog supply level to the word line is raised to a pump reset value of VRD and, as BLKSEL is also at VRD, the word lines on the other side of the select switch will also be raised to a level VDD. This initial BSTON pulse during R1/P1 CLK can help to accelerate the turn on process, particularly for low VRD levels that may not allow the M1 1601 to pass sufficient voltage to the BLKSEL line.

At the end of the R1/P1 CLK period, BSTON is lowered back to VRD and M1 1601 will subsequently act as a diode to prevent backflow from the BLKSEL line. VRDEC is then ramped up to the high supply level VPGMH, which in turn raises VTD and BLKSEL to VPGMH. The analog supply level from the charge pump system is also raised to VPGMH, bringing the word lines to the VUSEL level. The RDECAD signal is then de-asserted.

The waveforms of FIG. 17 include a BSTON pulse at 1701, during which BSTON is raised from VRD to a higher voltage VX2. With the trend toward lower operating voltages, if the VRD level used for the high logic value of RDECAD is the same as used is the analog high level used for other analog circuitry (VDDA), the VRD level at the gate of M1 1601 may not always sufficiently turn on to pass the VRD level at the input of M1 1601 for some process corners. For example, if a VRD=VDDA level of near 2V is used, the desired initial ramp-up of BLKSEL at 1703 may not occur with out the pulse to a higher voltage VX2 of, for example, close to 4V at 1701. Although this pulse can achieve the desired purpose, it delays the further ramp-up of BLKSEL to VPGMH until after the R1/P1 CLK period.

If, instead, the high logic level used for the level shifters VRD is decoupled from the main analog high level VDDA by use a separate supply source for VRD, a higher VRD level can be used, such as nearer to 3V. With this VRD level, there will be enough margin across process corners for M1 1601 to turn on to pass VRD to BLKSEL when BSTON stays at the VRD level. This is illustrated in the waveforms of FIG. 18.

Figure 18:
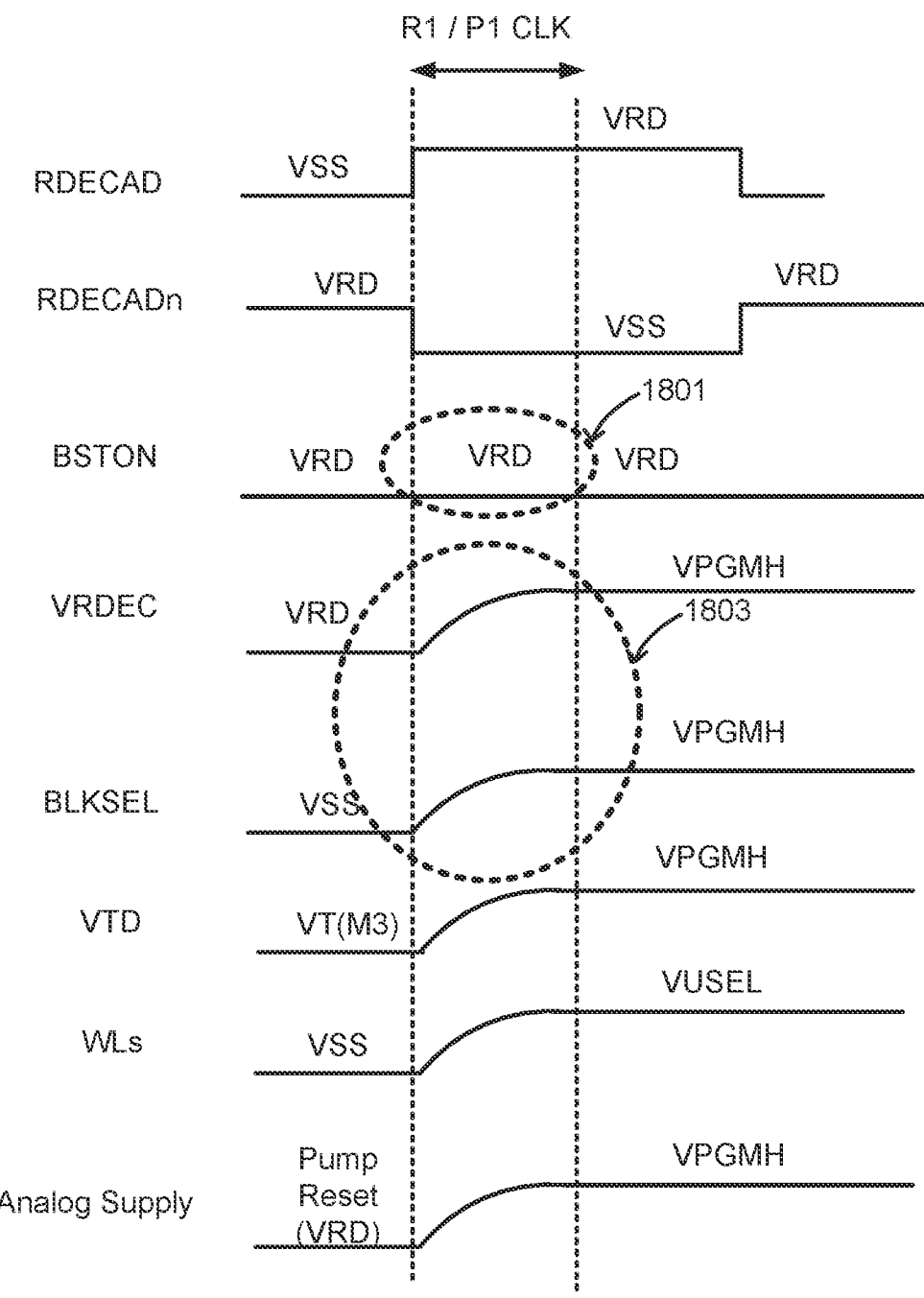
FIG. 18 is a set of waveforms for an embodiment of operating the level shifter of FIG. 16 without an initial pulse.

FIG. 18 is a set of waveforms for an embodiment of operating the level shifter of FIG. 16 without an initial pulse to facilitate turn on. The RDECAD/RDECADn waveforms are as before. The BSTON waveform now stays at VRD across the R1/P1 CLK period at 1801, rather than have the pulse at 1701 of FIG. 17 enabled. As indicated at 1803, this allows VRDEC and BLKSEL to begin to ramp-up at the beginning of the R1/P1 CLK, as will VTD. The analog supply pumps can also be enabled at the start of the R1/P1 CLK, resulting in the word lines beginning their ramp up to VUSEL at the beginning of the R1/P1 CLK. Consequently, as can be seen by comparing FIG. 18 with FIG. 17, the word line ramp-up time can be decreased by the duration of the R1/P1 CLK. This can further improve operating performance, whether used in conjunction with the techniques described with respect to FIGS. 13-15 or on its own.

Figure 19:
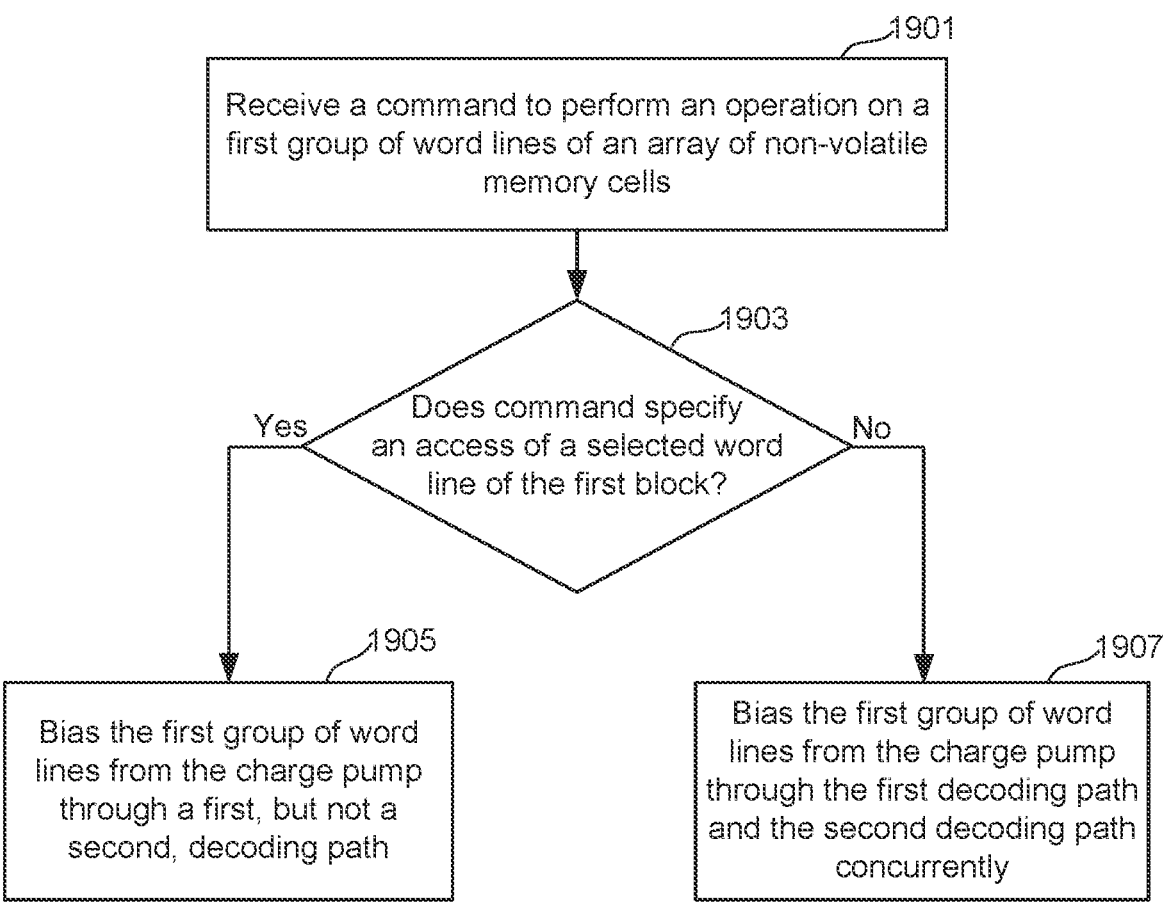
FIG. 19 is a flowchart for an embodiment for the decoding and biasing of a group of word lines of a non-volatile memory array for performing a memory operation.

FIG. 19 is a flowchart for an embodiment for the decoding and biasing of a group of word lines of a non-volatile memory array for performing a memory operation. Beginning at step 1901, a command is received at the memory device, such as over the interface 268 of the system control logic. The command can be received from the non-volatile memory controller 120 and originate on the non-volatile memory controller 120 or be a user command received from the host 102. For example, a command such as a read of user data or write of user data from the host 102 will specify the data and its logical address, which the non-volatile memory controller 120 will convert into physical addresses on the arrays of the memory device or devices of dies 200 or 201. The memory dies will have user data read or written based on a sequence of selected word lines, while, for each individual read or program, the unselected word lines of a selected block with be biased at unselected word line voltages such as read or program bypass levels. Other operations, including those originated on the non-volatile memory controller 120 or the system control logic 260, such as part of a built-in self-test (BIST) operation, include operations such as: leak of defect detection, such as that described above with respect to FIGS. 7A-12; refresh read operations; pre- or soft program; or other operations in which, for at least a portion of the operation, none of the word lines of a block are specified as selected, but rather all of the word lines are biased at a common voltage level, such as one of the unselected word line levels.

At step 1903, the control circuitry determines whether the received command specifies access of a selected word line. For example, an access such as a user read or user write will specify a selected word line on which to write, or from which to read, a page of user data. Depending on the embodiment, the determination can be made by the system control logic 260, specified by the non-volatile memory controller 120, or some combination of these. Based on the determination, in the embodiment above a parameter value (F_CGN_CGU_ON) can be set to specify the decoding mode to be used by the word line drivers and decoders of row control logic 220, such as the components represented in FIGS. 14-16.

If the command differentiates between selected and unselected word lines ("Yes" from 1903), in step 1905 the unselected word lines of a block with a selected word line or word lines are biased by the CGU path, as illustrated in FIG. 14. This leaves the CGN path available for selected word lines. If the command does not distinguish between selected and unselected word lines of a selected block, in step 1907 the word lines of the block are biased concurrently though both of the CGU and CGN paths, as illustrated in FIG. 15, to improve word line ramp-up.

The embodiments presented above decrease overall path resistance, increasing the ramp-up rate of unselected word lines and start the ramp-up process at an earlier stage of operations such as refresh read, leak detection, and soft/pre-program. An important advantage this technique is to provide test time reduction for leak detect operations, which can be very time consuming. Another advantage of an option to start word line ramp-up early and having a low resistance path for WL ramp-up is to provide an extra time margin available for word lines to settle completely to the wanted bias voltage level, which can reduce the failed bit count due to insufficient word line boost-up requirements. These results can be achieved without the usage or introduction of additional circuitry.

In view of the foregoing, a first embodiment is a non-volatile memory system comprising a control circuit configured to connect to an array of non-volatile memory cells connected along a plurality of word lines. The control circuit includes charge pump circuitry configured to generate a first word line bias voltage; and decoding circuitry configured to selectively connect the charge pump circuitry to the plurality of word lines, comprising a first decoding path between the charge pump circuitry and a first group of the plurality of word lines and a second decoding path between the charge pump circuitry and the first group of word lines. The control circuit configured to: in a first decoding mode, supply the first group of word lines with the first word line bias voltage by the first, but not the second, decoding path; and in a second decoding mode, concurrently supply the first group of word lines with the first word line bias voltage by the first decoding path and the second decoding path.

One embodiment includes a method comprising: receiving a command to perform an operation on a first group of word lines of an array of non-volatile memory cells; based on the command, selecting either a first decoding mode or a second decoding mode for biasing the first group of word lines from a charge pump circuit; in response to selecting the first decoding mode, biasing the first group of word lines from the charge pump circuit through a first decoding path, but not through a second decoding path; and in response to selecting the second decoding mode, biasing the first group of word lines from the charge pump through the first decoding path and the second decoding path concurrently.

One embodiment includes a non-volatile storage system comprising: an array of non-volatile memory cells connected along a first group of word lines; and one or more control circuits connected to the array. The one or more control circuits connected to the array include: a voltage supply circuit; and decoding and driver circuitry configured to bias the first group of word lines by way of a first bias path and a second bias path. The one or more control circuits configured to: receive a command to perform an operation on the first group of word lines; based on the command, select either a first decoding mode or a second decoding mode for biasing the first group of word lines from the voltage supply circuit; in response to selecting the first decoding mode, biasing the first group of word lines from the voltage supply circuit through the first bias path, but not through the second bias path; and in response to selecting the second decoding mode, biasing the first group of word lines from the voltage supply circuit through the first bias path and the second decoding path concurrently.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory system, comprising:

a control circuit configured to connect to an array of non-volatile memory cells connected along a plurality of word lines, the control circuit comprising:

charge pump circuitry configured to generate a first word line bias voltage;

decoding circuitry configured to selectively connect the charge pump circuitry to the plurality of word lines, comprising a first decoding path between the charge pump circuitry and a first group of the plurality of word lines and a second decoding path between the charge pump circuitry and the first group of word lines:

a word line selection circuit through which the decoding circuitry is connected to the first group of word lines; and a level shifter circuit configured to receive a logic level control signal and generate therefrom a high voltage control signal for the word line selection circuit, the level shifter circuit comprising a first NMOS transistor connected between the logic level control signal and a high voltage control signal for the word line selection circuit and a PMOS transistor having a gate connected to receive an inverse of the logic level control signal, the control circuit configured to:

in a first decoding mode, supply the first group of word lines with the first word line bias voltage by the first, but not the second, decoding path;

in a second decoding mode, concurrently supply the first group of word lines with the first word line bias voltage by the first decoding path and the second decoding path; and maintain a gate voltage for the first NMOS transistor at a high value for the logic level control signal while the logic level control signal is asserted.

2. The non-volatile memory system of claim 1, wherein the control circuit is formed on a control die, the non-volatile memory system further comprising:

a memory die including the array, the memory die separate from and bonded to the control die.

3. The non-volatile memory system of claim 1, wherein the control circuit is further configured to:

receive a first command; and select either the first decoding mode or the second decoding mode based on the first command.

4. The non-volatile memory system of claim 3, wherein the array of non-volatile memory cells comprises a plurality of blocks of the memory cells having a NAND architecture, the first group of word lines including word lines corresponding to a first block of the plurality of blocks of the memory cells, wherein the control circuit is further configured to:

in response to the first command specifying an access of a selected word line of the first block, select the first decoding mode for biasing unselected word lines of the first block.

5. The non-volatile memory system of claim 4, wherein the control circuit is further configured to:

in response to the first command specifying an access of a selected word line of the first block, bias the selected word line of the first block by the second decoding path.

6. The non-volatile memory system of claim 4, wherein the first command specifies a read of the selected word line of the first block.

7. The non-volatile memory system of claim 4, wherein the first command specifies a write of the selected word line of the first block.

8. The non-volatile memory system of claim 3, wherein the array of non-volatile memory cells comprises a plurality of blocks of the memory cells having a NAND architecture, the first group of word lines including word lines corresponding to a first of the plurality of blocks of the memory cells, wherein the control circuit is further configured to:

in response to the first command specifying all of the word lines of the first block being biased at a common bias level, select the second decoding mode for biasing all of the word lines of the first block.

9. The non-volatile memory system of claim 8, wherein the first command specifies a leak detection operation for the first block.

10. The non-volatile memory system of claim 8, wherein the first command specifies a refresh operation for the first block.

11. The non-volatile memory system of claim 8, wherein the first command specifies a pre-program operation for the first block.

12. The non-volatile memory system of claim 1 wherein the level shifter circuit further comprises:

a second NMOS transistor having a gate connected to the high voltage control signal for the word line selection circuit and connected between a high voltage supply level and, though the PMOS transistor, the high voltage control signal for the word line selection circuit.

13. A method, comprising:

receiving a command to perform an operation on a first group of word lines of an array of non-volatile memory cells;

based on the command, selecting either a first decoding mode or a second decoding mode for biasing the first group of word lines from a charge pump circuit by a decoding circuitry having a first decoding path and a second decoding path, the decoding circuitry being connected to the first group of word lines through a word line selection circuit;

in response to selecting the first decoding mode, biasing the first group of word lines from the charge pump circuit through the first decoding path, but not through the second decoding path; and in response to selecting the second decoding mode, biasing the first group of word lines from the charge pump through the first decoding path and the second decoding path concurrently, where biasing the first group of word lines includes:

receiving a logic level control signal at a level shifter circuit comprising a first NMOS transistor connected between the logic level control signal and a high voltage control signal for the word line selection circuit and a PMOS transistor having a gate connected to receive an inverse of the logic level control signal; and generating by the level shifter circuit from the logic level control signal of a high voltage control signal for the word line selection circuit, including maintaining a gate voltage for the first NMOS transistor at a high value for the logic level control signal while the logic level control signal is asserted.

14. The method of claim 13, wherein the array of non-volatile memory cells comprises a plurality of blocks of the memory cells having a NAND architecture, the first group of word lines including word lines corresponding to a first of the plurality of blocks of the memory cells, and wherein selecting either the first decoding mode or the second decoding mode comprises:

determining whether the command specifies an access of a selected word line of the first block; and in response to the command specifying the access of the selected word line, selecting the first decoding mode for biasing unselected word lines of the first block.

15. The method of claim 14, wherein selecting either the first decoding mode or the second decoding mode further comprises:

in response to the command specifying the access of the selected word line, biasing the selected word line by the second decoding path.

16. The method of claim 13, wherein the array of non-volatile memory cells comprises a plurality of blocks of the memory cells having a NAND architecture, the first group of word lines including word lines corresponding to a first of the plurality of blocks of the memory cells, and wherein selecting either the first decoding mode or the second decoding mode comprises:

determining whether the command specifies that all of the word lines of the first block being biased at a common bias level; and in response to the command specifying all of the word lines of the first block being biased at the common bias level, selecting the second decoding mode for biasing all of the word lines of the first block.

17. A non-volatile memory system, comprising:

an array including a plurality of non-volatile memory cells connected along a first group of word lines; and one or more control circuits connected to the array, comprising:

a voltage supply circuit;

decoding and driver circuitry configured to bias the first group of word lines by way of a first bias path and a second bias path;

a word line selection circuit through which the decoding and driver circuitry is connectable to the first group of word lines; and a level shifter circuit comprising a first NMOS transistor connected between the logic level control signal and a high voltage control signal for the word line selection circuit and a PMOS transistor having a gate connected to receive an inverse of the logic level control signal, the one or more control circuits configured to:

receive a command to perform an operation on the first group of word lines;

based on the command, select either a first decoding mode or a second decoding mode for biasing the first group of word lines from the voltage supply circuit;

in response to selecting the first decoding mode, bias the first group of word lines from the voltage supply circuit through the first bias path, but not through the second bias path; and in response to selecting the second decoding mode, bias the first group of word lines from the voltage supply circuit through the first bias path and the second decoding path concurrently, where biasing the first group of word lines includes:

receiving a logic level control signal at a level shifter circuit comprising a first NMOS transistor connected between the logic level control signal and a high voltage control signal for the word line selection circuit and a PMOS transistor having a gate connected to receive an inverse of the logic level control signal; and generating by the level shifter circuit from the logic level control signal of a high voltage control signal for the word line selection circuit, including maintaining a gate voltage for the first NMOS transistor at a high value for the logic level control signal while the logic level control signal is asserted.

18. The non-volatile memory system of claim 17, wherein the array of non-volatile memory cells comprises a plurality of blocks of the memory cells having a NAND architecture, the first group of word lines including word lines corresponding to a first block of the plurality of blocks of the memory cells, and wherein, to select either the first decoding mode or the second decoding mode, the one or more control circuits are configured to:

determine whether the command specifies an access of a selected word line of the first block;

in response to the command specifying the access of the selected word line, select the first decoding mode for biasing unselected word lines of the first block; and in response to the command not specifying the access of the selected word line, select the second decoding mode for biasing all of the word lines of the first block.

19. The non-volatile memory system of claim 17, wherein the one or more control circuits are further configured to:

receive a first command; and select either the first decoding mode or the second decoding mode based on the first command.

20. The non-volatile memory system of claim 19, wherein the array of non-volatile memory cells comprises a plurality of blocks of the memory cells having a NAND architecture, the first group of word lines including word lines corresponding to a first block of the plurality of blocks of the memory cells, wherein the one or more control circuits are further configured to:

in response to the first command specifying an access of a selected word line of the first block, select the first decoding mode for biasing unselected word lines of the first block.

* * * * *